United States Patent
Shiraishi et al.

(10) Patent No.: US 9,648,715 B2
(45) Date of Patent: May 9, 2017

(54) TARGET SUPPLY DEVICE

(71) Applicant: Gigaphoton Inc., Tochigi-ken (JP)

(72) Inventors: Yutaka Shiraishi, Oyama (JP);
Toshiyuki Hirashita, Oyama (JP);
Shinya Ikesaka, Oyama (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 15/143,066

(22) Filed: Apr. 29, 2016

(65) Prior Publication Data

US 2016/0249443 A1 Aug. 25, 2016

Related U.S. Application Data

(63) Continuation of application No. PCT/JP2014/082879, filed on Dec. 11, 2014.

(51) Int. Cl.
*H05G 2/00* (2006.01)
*G03F 7/20* (2006.01)

(52) U.S. Cl.
CPC ......... *H05G 2/006* (2013.01); *G03F 7/70033* (2013.01); *H05G 2/008* (2013.01); *H05G 2/005* (2013.01)

(58) Field of Classification Search
CPC .......... H05G 2/00; H05G 2/001; H05G 2/003; H05G 2/005; H05G 2/006; H05G 2/008; G03F 7/70033
See application file for complete search history.

(56) References Cited

U.S. PATENT DOCUMENTS

| 5,843,767 A | 12/1998 | Beattie |
| 2006/0192155 A1 | 8/2006 | Algots et al. |

| 2009/0230326 A1* | 9/2009 | Vaschenko | H05G 2/003 250/492.2 |
| 2011/0139707 A1 | 6/2011 | Siwy et al. | |
| 2011/0151181 A1 | 6/2011 | Liu | |
| 2012/0292527 A1* | 11/2012 | Fomenkov | B22F 3/105 250/432 R |
| 2013/0146682 A1 | 6/2013 | Ishihara et al. | |
| 2013/0186976 A1* | 7/2013 | Ishihara | B05B 17/06 239/102.1 |

FOREIGN PATENT DOCUMENTS

| JP | 2011-514648 A | 5/2011 |
| JP | 2013-514966 A | 5/2013 |
| JP | 2013-140771 A | 7/2013 |

OTHER PUBLICATIONS

International Search Report and Written Opinion issued in Application No. PCT/JP2014/082879, mailed Mar. 17, 2015.

* cited by examiner

*Primary Examiner* — David E Smith

(74) *Attorney, Agent, or Firm* — Studebaker & Brackett PC

(57) ABSTRACT

A target supply device may include: a target generator configured to accommodate a liquid target material and having a nozzle with a nozzle hole from which the liquid target material is outputted; and a filter disposed in the target generator and made of glass, the glass reacting with the liquid target material, so that a solid reaction product is generated. The filter may include a first through-hole configured to allow the liquid target material to pass therethrough, and an inner surface of the first through-hole may be coated with a material which is not easy to react with the liquid target material.

7 Claims, 18 Drawing Sheets

TARGET SUPPLY DEVICE

CROSS-REFERENCES TO RELATED APPLICATIONS

This application claims the benefit of International Patent Application No. PCT/JP2013/083514 filed Dec. 13, 2013, which is incorporated herein by reference.

BACKGROUND

1. Technical Field

The present disclosure relates to a target supply device.

2. Related Art

In recent years, as semiconductor processes become finer, transfer patterns for use in photolithographies of semiconductor processes have rapidly become finer. In the next generation, microfabrication at 45 nm to 70 nm, further, microfabrication at 32 nm or less would be demanded. In order to meet the demand for microfabrication at 32 nm or less, for example, it is expected to develop an exposure device in which a system for generating extreme ultraviolet (EUV) light at a wavelength of approximately 13 nm is combined with a reduced projection reflective optical system.

Three types of EUV light generation systems have been proposed, which include an LPP (laser produced plasma) type system using plasma generated by irradiating a target material with a laser beam, a DPP (discharge produced plasma) type system using plasma generated by electric discharge, and an SR (synchrotron radiation) type system using synchrotron orbital radiation.

CITATION LIST

Patent Literature

PTL1: U. S. Patent Application Publication No. 2012/0292527
PTL2: U. S. Patent Application Publication No. 2006/0192155
PTL3: U. S. Patent Application Publication No. 2011/0139707
PTL4: U.S. Pat. No. 5,843,767
PTL5: Japanese translation of PCT application No. 2011-514648
PTL6: Japanese Patent Application Laid-Open No. 2013-140771
PTL7: Japanese translation of PCT application No. 2013-514966

SUMMARY

According to one aspect of the present disclosure, a target supply device may include: a target generator configured to accommodate a liquid target material and having a nozzle with a nozzle hole from which the liquid target material is outputted; and a filter disposed in the target generator and made of glass, the glass reacting with the liquid target material, so that a solid reaction product is generated. The filter may include a first through-hole configured to allow the liquid target material to pass therethrough, and an inner surface of the first through-hole may be coated with a material which is not easy to react with the liquid target material.

According to one aspect of the present disclosure, a target supply device may include: a target generator configured to accommodate a liquid target material and having a nozzle with a nozzle hole from which the liquid target material is outputted; a filter disposed in the target generator and made of glass or a ceramic; a support member configured to abut on a surface of the filter in the nozzle hole side so as to support the filter; and a positioning part configured to position the filter and the support member in the target generator. The filter may include a first through-hole configured to allow the liquid target material to flow therethrough, and the support member may include a second through-hole having a bore diameter greater than a bore diameter of the first through-hole to allow the liquid target material flowing out of the first through-hole to flow therethrough.

BRIEF DESCRIPTION OF THE DRAWINGS

Hereinafter, selected embodiments of the present disclosure will be described with reference to the accompanying drawings by way of example.

DESCRIPTION OF EXEMPLARY EMBODIMENTS

Figure 1:
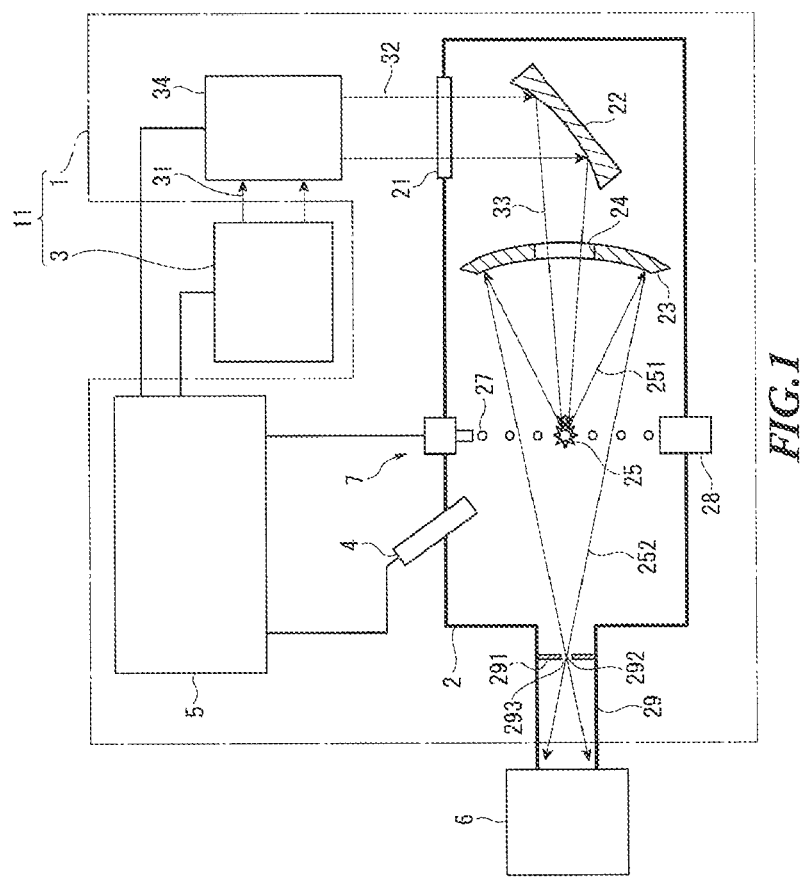
FIG. 1 schematically shows the configuration of an LPP type EUV light generation apparatus.

<Contents>
1. Overview
2. Overview of the EUV light generation apparatus
2.1 Configuration
2.2 Operation
3. EUV light generation apparatus including a target supply device
3.1 Description of terms
3.2 Embodiment 1
3.2.1 Configuration
3.2.2 Operation
3.3 Embodiment 2
3.3.1 Configuration
3.3.2 Operation
3.4 Embodiment 3
3.4.1 Configuration
3.4.2 Operation
3.5 Embodiment 4
3.5.1 Configuration
3.5.2 Operation
3.6 Embodiment 5
3.6.1 Configuration
3.6.2 Operation
3.7. Embodiment 6
3.7.1 Configuration
3.7.2 Operation
3.8 Embodiment 7
3.8.1 Configuration
3.8.2 Operation
3.9 Configuration examples of coating film
3.9.1 Configuration example 1
3.9.2 Configuration example 2
3.9.3 Configuration example 3
4. Modification Hereinafter, selected embodiments of the present disclosure will be described in detail with reference to the accompanying drawings The embodiments to be described below are merely illustrative in nature and do not limit the scope of the present disclosure. Further, the configurationn (s) and operation(s) described in each embodiment are not all essential in implementing the present disclosure. In addition, with the embodiments described with reference to the drawings except FIG. 1, the configurations shown in FIG. 1 which are not essential to explanation of the present disclosure may not be shown in the figures. Moreover, corresponding components may be referenced by corresponding reference numerals and characters, and therefore duplicate descriptions will be omitted.

1. Overview

According to an embodiment of the present disclosure, a target supply device includes: a target generator configured to accommodate a liquid target material and having a nozzle with a nozzle hole from which the liquid target material is outputted; and a filter disposed in the target generator and made of glass, the glass reacting with the liquid target material, so that a solid reaction product is generated. The filter includes a first through-hole configured to allow the liquid target material to pass therethrough, and an inner surface of the first through-hole is coated with a material which is not easy to react with the liquid target material.

According to an embodiment of the present disclosure, a target supply device includes: a target generator configured to accommodate a liquid target material and having a nozzle with a nozzle hole from which the liquid target material is outputted; a filter disposed in the target generator and made of glass or a ceramic; a support member configured to abut on a surface of the filter in the nozzle hole side so as to support the filter; and a positioning part configured to position the filter and the support member in the target generator. The filter includes a first through-hole configured to allow the liquid target material to flow therethrough, and the support member includes a second through-hole having a bore diameter greater than a bore diameter of the first through-hole to allow the liquid target material flowing out of the first through-hole to flow therethrough.

2. Overview of the EUV Light Generation Apparatus

2.1 Configuration

FIG. 1 schematically shows the configuration of an exemplary IPP type EUV light generation system. An EUV light generation apparatus 1 may be used with at least one laser device 3. In the present disclosure, the system including the EUV light generation apparatus 1 and the laser device 3 may be referred to as an EUV light generation system 11. As shown in FIG. 1, and as described in detail later, the EUV light generation apparatus 1 may include a chamber 2 and a target supply device 7. The chamber 2 may be sealed airtight. The target supply device 7 may be mounted onto the chamber 2, for example, to penetrate a wall of the chamber 2. A target material to be supplied from the target supply device 7 may include, but is not limited to, tin, terbium, gadolinium, lithium, xenon, or a combination of any two or more of them.

The chamber 2 may have at least one through-hole in its wall. A window 21 may be provided on the through-hole. A pulsed laser beam 32 outputted from the laser device 3 may transmit through the window 21. In the chamber 2, an EUV collector mirror 23 having a spheroidal reflective surface may be provided. The EUV collector mirror 23 may have a first focusing point and a second focusing point. The surface of the EUV collector mirror 23 may have a multi-layered reflective film in which molybdenum layers and silicon layers are alternately laminated. The EUV collector mirror 23 maybe preferably arranged such that the first focusing point of the EUV collector mirror 23 is positioned in a plasma generation region 25 and the second focusing point is positioned in an intermediate focusing (IF) point 292. The EUV collector mirror 23 may have a through-hole 24 formed at the center thereof so that a pulsed laser beam 33 may pass through the through-hole 24.

The EUV light generation apparatus 1 may further include an EUV light generation controller 5 and a target sensor 4. The target sensor 4 may have an imaging function and detect the presence, trajectory, position and speed of a droplet 27 as a target.

Further, the EUV light generation apparatus 1 may include a connection part 29 that allows the interior of the chamber 2 to be in communication with the interior of an exposure device 6. In the connection part 29, a wall 291 having an aperture 293 may be provided. The wall 291 may be positioned such that the second focusing point of the EUV collector mirror 23 lies in the aperture 293.

The EUV light generation apparatus 1 may also include a laser beam direction controller 34, a laser beam focusing mirror 22, and a target collector 28 for collecting the droplet 27. The laser beam direction controller 34 may include an optical element for defining the traveling direction of the laser beam and an actuator for adjusting the position or the posture of the optical element.

2.2 Operation

As shown in FIG. 1, a pulsed laser beam 31 outputted from the laser device 3 may pass through the laser beam direction controller 34, transmit through a window 21 as a pulsed laser beam 32, and then enter the chamber 2. The pulsed laser beam 32 may travel through the chamber 2 along at least one laser beam path, be reflected by the laser beam focusing mirror 22, and be applied to at least one droplet 27 as the pulsed laser beam 33.

The target supply device 7 may be configured to output the droplet 27 to the plasma generation region 25 in the chamber 2. The droplet 27 may be irradiated with at least one pulse of the pulsed laser beam 33. Upon being irradiated with the pulsed laser beam, the droplet 27 may be turned into plasma, and radiation light 251 may be emitted from the plasma. EUV light 252 contained in the radiation light 251 may be selectively reflected by the EUV collector mirror 23. EUV light 252 reflected by the EUV collector mirror 23 may be focused onto the IF point 292, and outputted to the exposure device 6. Here, one droplet 27 may be irradiated with multiple pulses of the pulsed laser beam 33.

The EUV light generation controller 5 may be configured to totally control the EUV light generation system 11. The EUV light generation controller 5 may be configured to process the image data of the droplet 27 captured by the target sensor 4. Further, the EUV light generation controller 5 may be configured to control, for example, the timing at which the droplet 27 is outputted, and the direction in which the droplet 27 is outputted. Furthermore, the EUV light generation controller 5 may be configured to control, for example, the timing at which the laser device 3 oscillates, the traveling direction of the pulsed laser beam 32, and the position on which the pulsed laser beam 33 is focused. The various controls described above are merely examples, and other controls may be added as necessary.

3. EUV Light Generation Apparatus Including the Target Supply Device

3.1 Description of Terms

Hereinafter, in the description by using the drawings other than FIG. 1, terms related to the directions may be defined with respect to X, Y, and Z axes shown in each drawing. Note that these terms do not describe the relationship with a direction of gravity 10B. A pressure applied to the target material 270, which is the minimum pressure that allows the target material 270 to be infiltrated into a through-hole having a predetermined bore diameter, may be referred to as "infiltration pressure." In addition, the value of the infiltration pressure calculated based on the surface tension of the target material 270 may be referred to as "calculated value of the infiltration pressure." Meanwhile, the value of the infiltration pressure determined by an experiment may be referred to as "measured value of the infiltration pressure."

3.2 Embodiment 1

3.2.1 Overview

With the target supply device according to Embodiment 1 of the present disclosure, filters may be made of glass containing lead. With the target supply device according to Embodiment 1 of the present disclosure, a material which is not easy to react with a liquid target material may be $Al_2O_3$ (aluminium oxide), $Cr_2O_3$ (chromium (III) oxide), $Y_2O_3$ (yttrium oxide), or $TiB_2$ (titanium boride). With the target supply device according to Embodiment 1 of the present disclosure, a material which is not easy to react with a liquid target material may be $Al_2O_3$ (aluminium oxide), $Y_2O_3$ (yttrium oxide), $SiO_2$ (silicon dioxide), AlN (aluminum nitride) or $ZrO_2$ (zirconium oxide). The target supply device according to Embodiment 1 of the present disclosure may include a support member configured to abut on the surface of the filter in the nozzle hole side so as to support the filter, and a positioning part configured to position the filter and the support member in a target generator. The support member may include a plurality of second through-holes each having a bore diameter greater than the bore diameter of a first through-hole to allow the liquid target material flowing out of the first through-holes to flow therethrough. With the target supply device according to Embodiment 1 of the present disclosure, the support member may be made of molybdenum, quartz glass, or sapphire.

3.2.2 Configuration

Figure 2:
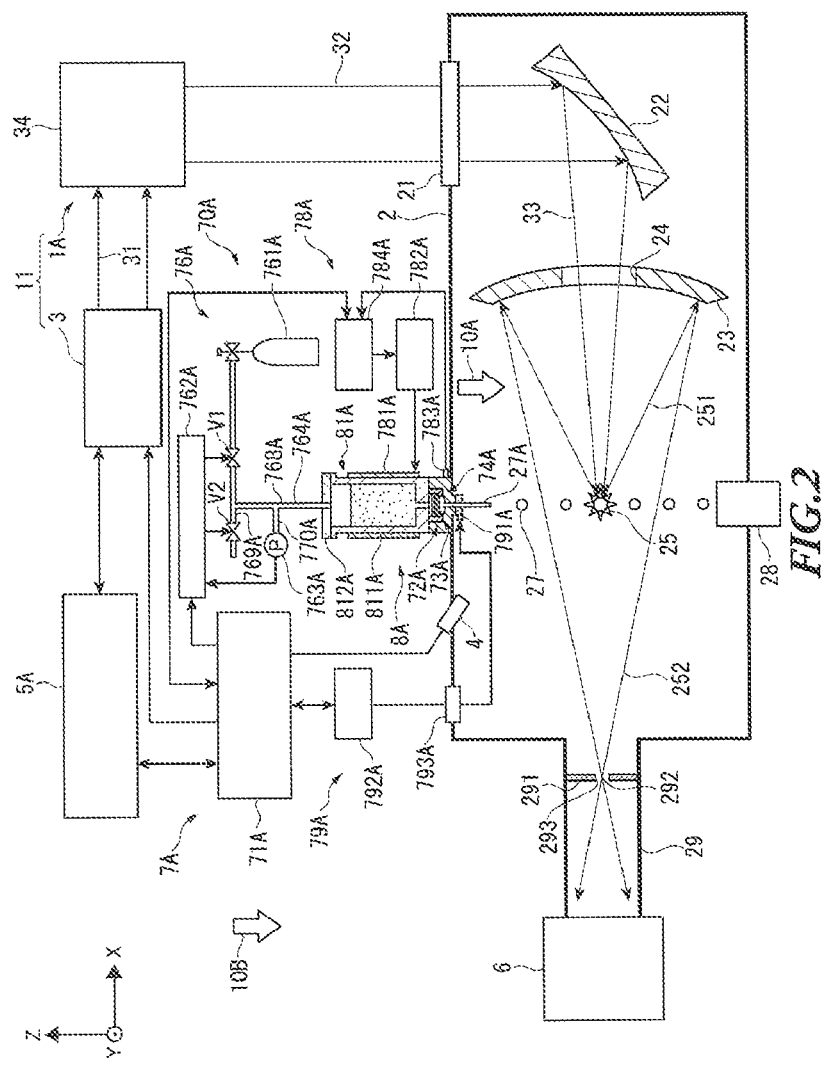
FIG. 2 schematically shows the configuration of the EUV light generation apparatus including a target supply device according to Embodiment 1.
Figure 3:
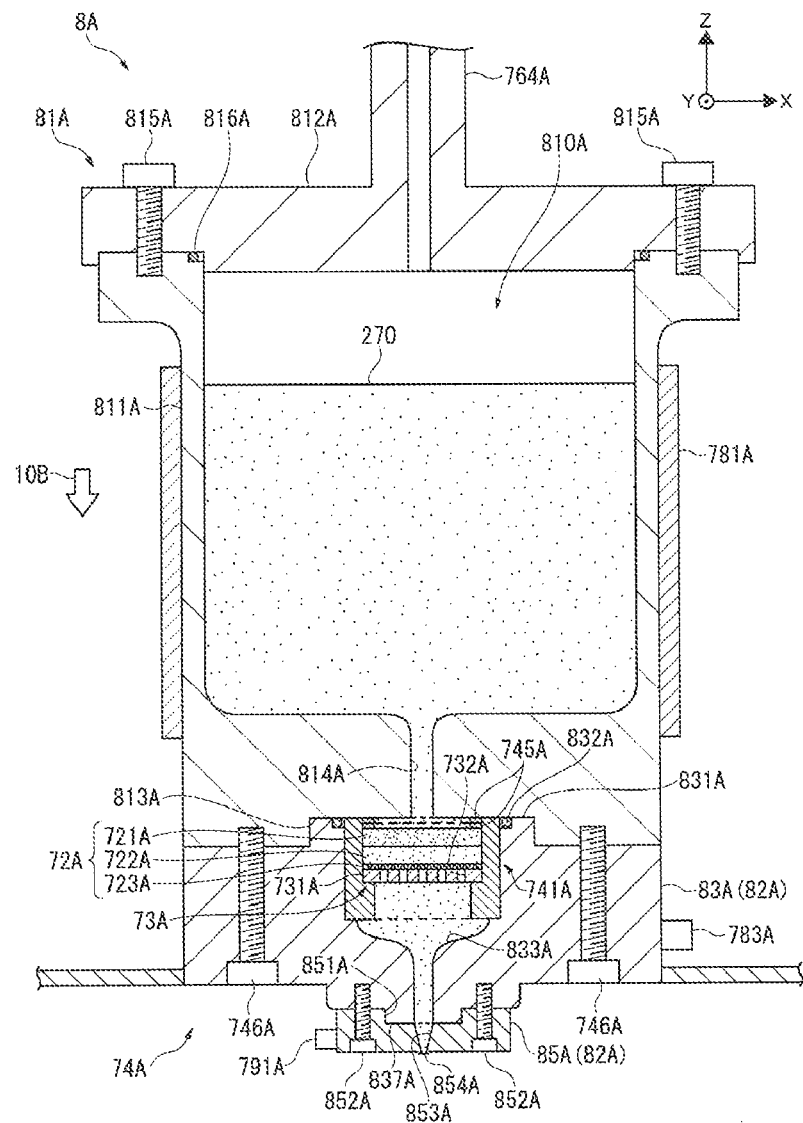
FIG. 3 schematically shows the configuration of the target supply device.
Figure 4:
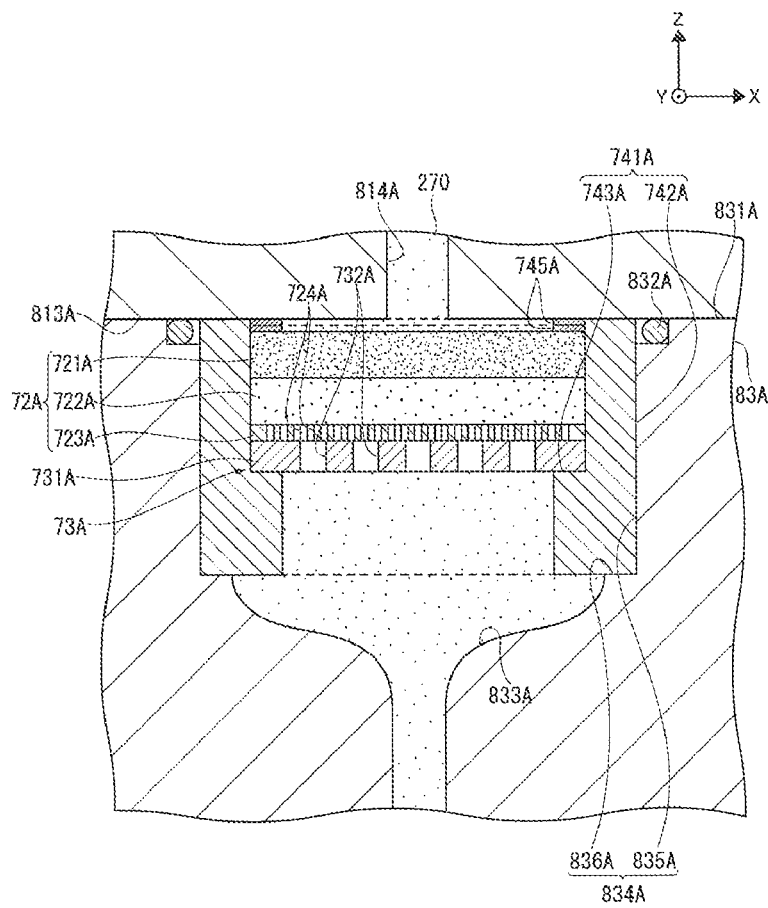
FIG. 4 shows an installed state of a filer part and a support part in the target supply device.
Figure 5:
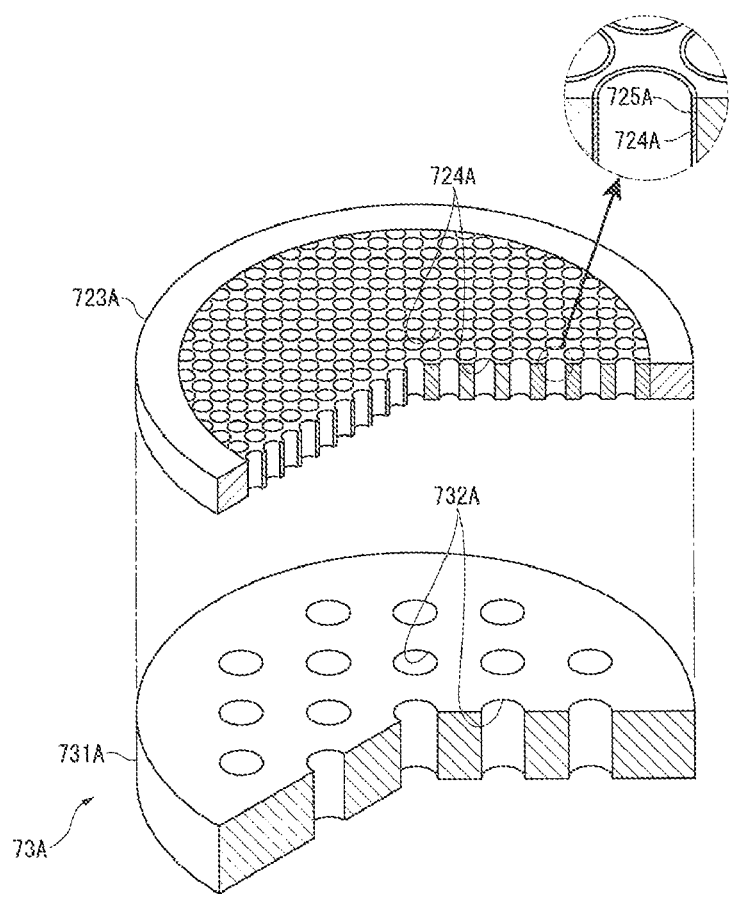
FIG. 5 is a perspective view schematically showing a third filter and a support plate.

FIG. 2 schematically shows the configuration of the EUV light generation apparatus including the target supply device according to Embodiment 1. FIG. 3 schematically shows the configuration of the target supply device. FIG. 4 shows the installed state of a filter part and a support part of the target supply device. FIG. 5 is a perspective view schematically showing a third filter and a support plate.

As shown in FIG. 2, an EUV light generation apparatus 1A may include the chamber 2 and a target supply device 7A. The target supply device 7A may include a target generation part 70A and a target controller 71A. The laser device 3, the target sensor 4 and an EUV light generation control system 5A may be electrically connected to the target controller 71A.

As shown in FIG. 2 and FIG. 3, the target generation part 70A may include a target generator 8A, a filter part 72A, a support part 73A, a positioning part 74A, a pressure regulator 76A, a temperature controller 78A and a piezo part 79A.

The target generator 8A may include a tank 81A, a nozzle base part 83A, and a nozzle tip part 85A. The tank 81A, the nozzle base part 83A, and the nozzle tip part 85A may be made of a material such as molybdenum having a low reactivity with the target material 270. The tank 81A may include a tank body 811A and a lid part 812A. The tank body 811A may be formed in an approximately cylindrical shape and have the second surface as a wall surface in the −Z direction side. The tank body 811A may include a hollow part as an accommodating space 810A. A concave portion 813A formed as an approximately circular hollow in the +Z direction may be provided in the center of the second surface of the tank body 811A. A through-hole 814A in communication with the accommodating space 810A may be provided at the center of the concave portion 813A. The entire second surface of the tank body 811A may be polished. The lid part 812A may be formed as an approximately circular plate to close the first surface of the tank body 811A in the +Z direction side. The lid part 812A may be fixed to the first surface of the tank body 811A with a plurality of bolts 815A. In this case, an O ring 816A may be fitted in a groove formed in the first surface of the tank body 811A so as to seal between the tank body 811A and the lid part 812A.

The nozzle base part 83A may be formed in an approximately cylindrical shape. The outside diameter of the nozzle base part 83A may be approximately the same as the outside diameter of the tank body 811A. A first convex portion 831A in a shape similar to the shape of the concave portion 813A of the tank body 811A may be provided on the first surface of the nozzle base part 83A in the +Z direction side. The nozzle base part 83A may be fixed to the second surface of the tank body 811A with bolts 746a (described later) of the positioning part 74A. In this case, an O ring 832A may be fitted in a groove formed in the first surface of the first convex portion 831A in the +Z direction side so as to seal between the tank body 811A and the nozzle base part 83A.

As shown in FIG. 3 and FIG. 4, a through-hole 833A that penetrates the nozzle base part 83A in the vertical direction, i.e., the Z-axis direction, may be provided in the center of the nozzle base part 83A. The through-hole 833A may communicate with the through-hole 814A. An accommodating part 834A may be located in the +Z direction side of the through-hole 833A. A holder 741A (described later) of the positioning part 74A may be accommodated in the accommodating part 834A. The accommodating part 834A may include a first abutting part 835A and a second abutting part 836A. The first abutting part 835A may abut on the outer periphery of the holder 741A. The second abutting part 836A may abut on the second surface of the holder 741A. The surface of the second abutting part 836A that abuts on the holder 741A may be polished.

A convex portion 837A may be provided in the second surface of the nozzle base part 83A in the −Z direction side. The convex portion 837A may protrude as an approximately circular plate in the −Z direction. The opening of the through-hole 833A may be formed in the convex portion 837A.

As shown in FIG. 3, the nozzle tip part 85A may be formed as an approximately circular plate. The outside diameter of the nozzle tip part 85A may be smaller than the outside diameter of the nozzle base part 83A. A concave portion 851A formed as an approximately circular hollow in the −Z direction may be provided in the center of the first surface of the nozzle tip part 85A. The convex portion 837A of the nozzle base part 83A may be fitted in the concave portion 851A. The part of the concave portion 851A that abuts on the convex portion 837A may be polished. The nozzle tip part 85A may be fixed to the second surface of the nozzle base part 83A with a plurality of bolts 852A penetrating the nozzle tip part 85A.

A through-hole 853A that penetrates the nozzle tip part 85A in the vertical direction, i.e., the Z-axis direction, may be provided in the center of the nozzle tip part 85A. The through-hole 853A may communicate with the through-hole 833A. The through-hole 853A may be formed such that its diameter is reduced in the −Z direction. The end of the through-hole 853A in the −Z direction side may be a nozzle hole 854A. The diameter of the nozzle hole 854A may be 1 µm to 3 µm.

The nozzle base part 83A and the nozzle tip part 85A may constitute a nozzle 82A for outputting the target material 270 in the accommodating space 810A into the chamber 2 as the droplet 27. The nozzle 82A may be made of a material having a low wettability with the target material 270. To be more specific, the material having a low wettability with the target material 270 may have a contact angle of equal to or greater than 90 degrees with the target material 270. The material having a contract angle of equal to or greater than 90 degrees may be any of silicon carbide (SiC), silicon dioxide ($SiO_2$), aluminium oxide ($Al_2O_3$), molybdenum, tungsten and tantalum. The target generator 8A may be provided such that the tank 81A and the nozzle base part 83A are located outside the chamber 2 and the nozzle tip part 85A is located inside the chamber 2.

A preset output direction of the droplet 27 does not necessarily match the direction of gravity 10B depending on the installation state of the chamber 2. The preset output direction of the droplet 27 may be the central axis direction of the nozzle hole 854A, and hereinafter referred to as "set output direction 10A." The output direction of the droplet 27 may be set such that the droplet 27 is outputted in an oblique direction or a horizontal direction, with respect to the direction of gravity 10B. Here, with Embodiment 1, the chamber 2 may be installed such that the set output direction 10A matches the direction of gravity 10B.

The target material 270 may contain particles as foreign materials. The particles may be generated by reacting the target material 270 with impurities or oxygen, or may be contained in the raw material of the target material 270. Otherwise, the particles may be produced due to the abrasion of the target material 270 caused by the friction of the target material 270 against the tank 81A.

As shown in FIG. 3 and FIG. 4, the filter part 72A may include a first filter 721A, a second filter 722A, and a third filter 723A. The first and second filters 721A and 722A may be made of a porous material to collect the particles contained in the target material 270. The first filter 721A may have an enormous number of through-pores each having a bore diameter of, for example, about 10 µm. Likewise, the second filter 722A may have an enormous number of through-pores each having a bore diameter of, for example, about 3 µm. As described above, the size of each of the through-pores may be different between the first filter 721A and the second filter 722A. In addition, the through-pores of the first and second filters 721A and 722A may bend in different directions and penetrate the filters. Each of the first and second filters 721A and 722A may be formed as an approximately circular plate, and has a diameter greater than the maximum inside diameter of the through-hole 833A.

The first and second filters 721A and 722A may be made of a material having a low reactivity with the target material 270. The difference in the coefficient of linear thermal expansion between the material of the first and second filters 721A and 722A and the material of the target generator 8A may be smaller than 20% of the coefficient of linear thermal expansion of the material of the target generator 8A. When the target material 270 is tin, the target generator 8A may be made of molybdenum having a low reactivity with tin. When the target generator 8A is made of molybdenum or tungsten, the first and second filters 721A and 722A may be made of any of materials shown in the following Table 1. The coefficient of linear thermal expansion of molybdenum is $5.2 \times 10^6$. The coefficient of linear thermal expansion of tungsten is $4.6 \times 10^{-6}$.

TABLE 1

| Type of filter | Filter structure | Material | coefficient of linear thermal expansion(×10⁻⁶) |
|---|---|---|---|
| Glass porous filter | Porous glass | $Al_2O_3$—$SiO_2$ glass | 6.0 |
| Ceramic porous filter | Porous ceramics | SiC | 4.1 |
| | | WC | 5.2 |
| | | AlN | 4.8 |
| | | $ZrB_2$ | 5.9 |
| | | $B_4C$ | 5.4 |

The material of the first and second filters 721A and 722A may be, for example, shirasu porous glass (SPG) provided by SPG Technology Co., Ltd. The SPG may be porous glass made from volcanic ash known as "shirasu." The SPG may be a ceramic according to the present disclosure. When the SPG is used as the material, each of the first and second filters 721A and 722A may be formed as an approximately circular plate. In this case, for example, the dimension of each of the first and second filters 721A and 722A in the Z-axis direction, i.e., the thickness direction, may be about 3 mm, and the diameter of each of the first and second filters 721A and 722A may be about 20 mm. The composition ratio of the SPG may be as shown in the following Table 2.

TABLE 2

| composition | $SiO_2$ | $B_2O_3$ | $Al_2O_3$ | $Na_2O$ | CaO | MgO | $K_2O$ |
|---|---|---|---|---|---|---|---|
| ratio | 58 | 9 | 11 | 8 | 4 | 3 | 3 |

When the SPG is used as the material, each of the first and second filters 721A and 722A may have an enormous number of through-pores each having a bore diameter of equal to or more than 3 μm and equal to or less than 20 μm, and bending in different directions.

The third filter 723A may be a filter according to the present disclosure. The third filter 723A may be disposed in the target generator 8A and formed by a plurality of capillaries to collect the particles contained in the target material 270. As shown in FIG. 5, the third filter 723A may be formed as an approximately circular plate, and have a diameter of about 20 mm which is approximately the same as the diameter of the first and second filters 721A and 722A. The dimension of the third filter 723A in the Z-axis direction, i.e., the thickness, may be about 0.5 mm. As shown in FIG. 4 and FIG. 5, the third filter 723A may have a number of first through-holes 724A penetrating the third filter 723A in the Z-axis direction, i.e., the thickness direction. The bore diameter of the first through-hole 724A may be 0.1 μm to 2 μm. The third filter 723A may be formed by bundling and binding the plurality of capillaries having the first through-holes 724A. The open area ratio of the third filter 723A may be about 30%. The open area ratio may be calculated by dividing the total area of the openings of a number of first through-holes 724A by the area of the first surface of the third filter 723A in the +Z direction side.

The third filter 723A may be made of glass that reacts with the liquid target material 270 to generate a solid reaction product. The glass for making capillaries of the third filter 723A may have a low melting point. Since the capillaries are made of glass having a low melting point, it is possible to form capillaries each having a smaller bore diameter than when the capillaries are made of quartz glass having a high melting point. As a result, it is possible to form the third filter 723A with the first through-holes 724A each having a smaller bore diameter than when the third filter 723A is made of quartz glass. The glass having a low melting point may contain lead. The composition, the softening point, and the coefficient of linear thermal expansion of the glass containing lead may be as shown in the following Tables 3, 4 and 5.

TABLE 3

| Composition (mol %) | | | Softening | coefficient of linear |
|---|---|---|---|---|
| $B_2O_3$ | $SiO_2$ | PbO | point (° C.) | thermal expansion(×10⁻⁶) |
| — | 60 | 40 | 568 | 7.4 |
| — | 40 | 60 | 429 | 10.8 |
| 50 | — | 50 | 435 | 9.3 |
| 40 | — | 60 | 383 | 10.8 |
| 30.5 | — | 69.5 | 330 | 12.4 |
| 26.5 | 30.8 | 42.7 | 477 | 8.5 |
| 17.6 | 20.4 | 62 | 371 | 11.7 |

TABLE 4

| Composition (wt %) | | | | Softening | coefficient of linear |
|---|---|---|---|---|---|
| $Al_2O_3$ | $B_2O_3$ | $SiO_2$ | PbO | point (° C.) | thermal expansion(×10⁻⁶) |
| 5 | 10 | 5 | 80 | 399 | 9.34 |
| 4.5 | 11 | 4.5 | 80 | 394 | 9.45 |
| 4 | 12 | 4 | 80 | 394 | 9.43 |
| 3.5 | 13 | 3.5 | 80 | 393 | 9.48 |
| — | 20 | — | 80 | 403 | 9.9 |

TABLE 5

| Composition (wt %) | | | | | Softening point | coefficient of linear thermal |
|---|---|---|---|---|---|---|
| $Al_2O_3$ | $B_2O_3$ | $SiO_2$ | ZnO | PbO | (° C.) | expansion (×10⁻⁶) |
| 11 | 11 | 3 | — | 75 | 440 | 8.3 |
| 2.5 | 18 | 2.5 | 5 | 72 | 428 | 8.3 |
| 2.5 | 14 | 2.5 | 15 | 67.5 | 414 | 8.13 |
| — | 12.4 | 1.8 | 17.5 | 68.4 | 402 | 8.23 |

The composition of the third filter 723A according to the present disclosure may be $SiO_2$:PbO=60:40 (mol %) as shown in the first line of Table 3. In a case in which the target material 270 is tin, when the third filter 723A is made of the glass having a low melting point as shown in Tables 3 to 5, a reductive reaction may take place between tin and PbO as shown in the following expressions (1) and (2).

$$PbO+Sn \rightarrow Pb+SnO \text{ (solid)} \quad (1)$$

$$2PbO+Sn \rightarrow 2Pb+SnO_2 \text{ (solid)} \quad (2)$$

When the third filter 723A is made of the glass having a low melting point, a solid lead may be precipitated because the third filter 723A contains $SiO_2$ and PbO. If a solid lead is precipitated from the glass having a low melting point, the remaining glass structure may be damaged, and therefore a solid $SiO_2$ may be produced. As a result, when the glass having a low melting point which makes the third filter 723A reacts with tin as the target material 270, particles of such as SnO, $SO_2$, and $SiO_2$ may be produced.

As shown in FIG. 5, a coating film 725A may be provided on the inner surface of the first through-hole 724A of the third filter 723A. The coating film 725A may be made of a material that is not easy to react with the liquid target material 270. By providing the coating film 725A on the inner surface of the first through-hole 724A, it is possible to prevent the reaction between lead contained in the glass having a low melting point which makes the third filter 723A and tin as the target material 270, and therefore to prevent the production of particles of such as SnO, $SnO_2$, and $SiO_2$. The material which is not easy to react with the liquid target material 270 may be any of the materials as shown in the following Table 6.

TABLE 6

| Material | coefficient of linear thermal expansion($\times 10^{-6}$) | Possibility of film formation by ALD |
|---|---|---|
| $Al_2O_3$ | 7.2 | possible |
| $Cr_2O_3$ | 7.8 | impossible |
| $Y_2O_3$ | 7.2 | possible |
| $TiB_2$ | 7.8 | impossible |
| $SiO_2$ | 0.5 | possible |
| AlN | 4.8 | possible |
| $ZrO_2$ | 10.5 | possible |

When the composition of the third filter 723A is $SiO_2$: PbO=60:40 (mol %), the coefficient of linear thermal expansion of the third filter 723A is $7.4 \times 10^{-6}$. The coating film 725A may be made of any of $Al_2O_3$ (aluminium oxide), $Cr_2O_3$ (chromium (III) oxide), $Y_2O_3$ (yttrium oxide), and $TiB_2$ (titanium boride). In this case, the coefficient of linear thermal expansion of the coating film 725A may be approximately the same as the coefficient of linear thermal expansion of the third filter 723A. As a result, even though the target generator 8A is heated and cooled repeatedly, the degree of expansion and construction is approximately the same between the third filter 723A and the coating film 725A. Therefore, it is possible to prevent the coating film 725A from peeling off the third filter 723A.

The coating film 725A may be made of any of $Al_2O_3$ (aluminium oxide), $Y_2O_3$ (yttrium oxide), $SiO_2$ (silicon dioxide), AlN (aluminum nitride), and $ZrO_2$ (zirconium oxide). In this case, by using ALD (automatic layer deposition), the coating film 725A having a thickness of 5 nm to 30 nm, which is thin and uniform, may be formed on the inner surfaces of the first through-holes 724A. However, when conventional film formation methods such as CVD (chemical vapor deposition) and PVD (physical vapor deposition) are used to form the coating film 725A, it is difficult to form the coating film 725A having a uniform thickness as compared to when the ALD method is used. As described above, by using the ALD method to form the coating film 725A, it is possible to more effectively prevent the reaction between lead contained in the glass having a low melting point which makes the third filter 723A and tin as the target material 270, than when the CVD method or the PVD method is used to form the coating film 725A.

The coating film 725A may be made of either $Al_2O_3$ (aluminium oxide) or $Y_2O_3$ (yttrium oxide) in view of the difficulty to peel the coating film 725A from the third filter 723A, and in view of the ease to form the coating film 725A having a uniform thickness.

The support part 73A may include a support plate 731A. The support plate 731A may be a support member according to the present disclosure. As shown in FIGS. 3 to 5, the support plate 731A may be formed as an approximately circular plate, and has a diameter of about 20 mm which is approximately the same as the diameter of the first, second, and third filters 721A, 722A and 723A. The support plate 731A may be made of a material having a low reactivity with the target material 270. When the target material 270 is tin, the support plate 731A may be made of molybdenum having a low reactivity with tin. The support plate 731A may include second through-holes 732A penetrating the support plate 731A in the Z-axis direction, i.e., the thickness direction. The number of the second through-holes 732A may be smaller than the number of the first through-holes 724A. The bore diameter of the second through-hole 732A may be greater than the bore diameter of the first through-hole 724A of the third filter 723A. The bore diameter of the second through-hole 732A may be 1 mm to 2 mm.

The positioning part 74A may position the filter part 72A and the support part 73A in the target generator 8A. As shown in FIG. 3 and FIG. 4, the positioning part 74A may include a holder 741A, a shim 745A and bolts 746A. As shown in FIG. 4, the holder 741A may include a tubular part 742A, and an abutting part 743A. The first surface of the holder 741A in the +Z direction side and the second surface of the holder 741A in the -Z direction side may be polished. The holder 741A may be accommodated in the accommodating part 834A of the nozzle base part 83A.

The shim 745A may be made of a material having a low reactivity with the target material 270. The difference in the coefficient of linear thermal expansion between the material of the first, second, and third filters 721A, 722A and 723A, and the support plate 731A and the material of the shim 745A may be smaller than 20% of the coefficient of linear thermal expansion of the material of the shim 745A. For example, when the first and second filters 721A and 722A are made of SPG; the third filter 723A is made of glass containing lead and having a low melting point; the support plate 731A is made of molybdenum; and the target material 270 is tin, the shim 745A may be made of molybdenum. The shim 745A may be formed as an approximately annular disk.

The support plate 731A may be accommodated in the holder 741A. The support plate 731A may be placed on the abutting part 743A of the holder 741A. In the holder 741A, the first, second, and third filters 721A, 722A, and 723A may be stacked in the Z-axis direction on the support plate 731A in the +Z direction side. In this case, the first filter 721A may be located in the +Z direction side while the third filter 723A may be located in the -Z direction side. As described above, these filters may be arranged such that the sizes of the through-pores and the first through-holes 724A are gradually reduced along the output direction of the target material 270. In the holder 741A, for example, two shims 745A may be stacked on the first filter 721A in the +Z direction side. For example, two shims 745A may be stacked inside the accommodating part 834A. When a plurality of shims 745A are used, the thicknesses of the shims 745A may be the same or different from each other.

The bolts 746A may penetrate the nozzle base part 83A and be threadably engaged with the tank body 811A. By this means, it is possible to provide sealing between the support plate 731A and the abutting part 743A, between the shim 745A in the -Z direction side and the first filter 721A, between the plurality of shims 745A, and between the shim 745A in the +Z direction side and the tank body 811A. The support plate 731A may abut on the entire surface of the third filter 723A in the nozzle hole 854A side so as to be able to support the third filter 723A. The first through-holes 724A of the third filter 723A may communicate with the second through-holes 732A of the support plate 731A.

As shown in FIG. 2 and FIG. 3, a pipe 764A may be provided to extend from the lid part 812A of the tank 81A. One end of a pipe 768A may be connected to the end of the pipe 764A in the +Z direction side via a joint (not shown). The other end of the pipe 768A may be connected to an inert gas bomb 761A via the pressure regulator 76A. With this configuration, the inert gas in the inert gas bomb 761A may be supplied to the target generator 8A.

The pressure regulator 76A may be provided on the pipe 768A. The pressure regulator 76A may include a first valve V1, a second valve V2, a pressure controller 762A and a pressure sensor 763A. The first valve V1 may be provided on the pipe 768A. A pipe 769A maybe connected to the pipe 768A at a position closer to the tank 81A than the first valve V1. The first end of the pipe 769A may be connected to the side surface of the pipe 768A. The second end of the pipe 769A may be open. The second valve V2 may be provided on the way of the pipe 769A. The first valve V1 and the second valve V2 may be any of a gate valve, a ball valve, and a butterfly valve. The first valve V1 and the second valve V2 may be the same type of valves, or different type of valves. The pressure controller 762A may be electrically connected to the first valve V1 and the second valve V2. The target controller 71A may send signals related to the first valve V1 and the second valve V2 to the pressure controller 762A. The first valve V1 and the second valve V2 may be individually switched between the opening and closing, based on the signal sent from the pressure controller 762A. The pipes 764A, 768A, 769A, and 770A may be made of, for example, stainless steel.

When the first valve V1 opens, the inert gas in the inert gas bomb 761A may be supplied into the target generator 8A via the pipes 768A and 764A. When the second valve V2 is closed, it is possible to prevent the inert gas existing in the pipes 768A and 764A, and the target generator 8A from being discharged from the second end of the pipe 769A to the outside of the pipe 769A. Therefore, when the first valve V1 opens while the second valve 2 closes, the pressure in the target generator 8A may increase to the value of the pressure in the inert gas bomb 761A. After that, the pressure in the target generator 8A may be maintained at the value of the pressure in the inert gas bomb 761A. When the first valve V1 is closed, it is possible to prevent the inert gas in the inert gas bomb 761A from being supplied into the target generator 8A via the pipes 768A and 764A. Then, the second valve V2 opens, the inert gas existing in the pipes 768A and 764A, and the target generator 8A may be discharged from the second end of the pipe 769A to the outside of the pipe 769A, due to the pressure difference between the inside and the outside of the pipes 768A and 764A and the target generator 8A. By this means, when the first valve V1 closes and the second valve V2 opens, the pressure in the target generator 8A may be reduced.

A pipe 770A may be connected to the pipe 768A at a position closer to the tank 81A than the pipe 769A. The first end of the pipe 770A may be connected to the side surface of the pipe 768A. The pressure sensor 763A may be provided on the second end of the pipe 770A. The pressure controller 762A may be electrically connected to the pressure sensor 763A. The pressure sensor 763A may detect the pressure of the inert gas existing in the pipe 770A and send a signal corresponding to the detected pressure to the pressure controller 762A. The pressure in the pipe 770 may be approximately the same as the pressure in the pipe 768A, the pipe 764A and the target generator 8A.

The temperature controller 78A may be configured to control the temperature of the target material 270 in the tank 81A. The temperature controller 78A may include a heater 781A, a heater power source 782A, a temperature sensor 783A and a temperature controller 784A. The heater 781A may be provided on the outer periphery of the tank 81A. The heater power source 782A may supply electric power to the heater 781A to allow the heater 781A to generate heat, based on a signal from the temperature controller 784A. By this means, it is possible to heat, via the tank 81A, the target material 270 in the tank 81A. The temperature sensor 783A may be provided on the outer periphery of the tank 81A in the nozzle 82A side, or inside the tank 81A. The temperature sensor 783A may be configured to detect mainly the temperature of and around the position at which the temperature sensor 783A is installed in the tank 81A, and send a signal corresponding to the detected temperature to the controller 784A. The temperature of and around the installation position of the temperature sensor 783A may be approximately the same as the temperature of the target material 270 in the tank 81A. The temperature controller 784A may be configured to output a signal for controlling the temperature of the target material 270 to a predetermined temperature to the heater power source 782A, based on the signal from the temperature sensor 783A.

The piezo part 79A may include a piezoelectric element 791A and a power source 792A. The piezoelectric element 791A may be provided on the outer periphery of the nozzle tip part 85A of the nozzle 82A in the chamber 2. Instead of the piezoelectric element 791A, a mechanism that can apply rapid vibration to the nozzle tip part 85A of the nozzle 82A may be provided. The power source 792A may be electrically connected to the piezoelectric element 791A via a feedthrough 793A. The power source 792A may be electrically connected to the target controller 71A. The target generation part 70A may be configured to generate jet 27A by the continuous jet method and vibrate the jet 27A outputted from the nozzle 82A to generate the droplet 27.

3.2.3 Operation

Figure 6:
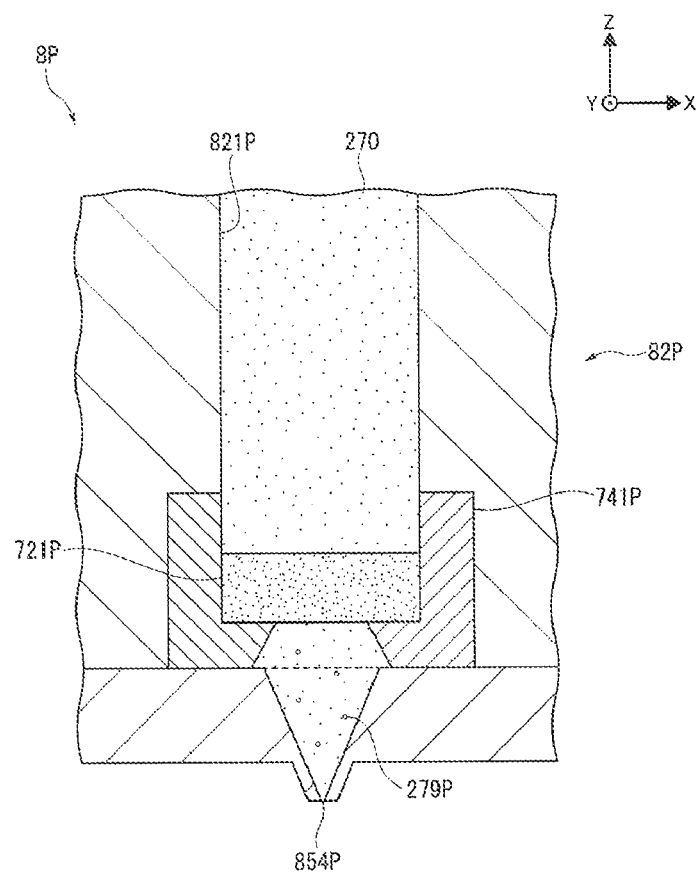
FIG. 6 schematically shows a problem occurring when a target material is heated to a predetermined temperature equal to or higher than the melting point of the target material.

FIG. 6 schematically shows a problem occurring when a target material is heated to a predetermined temperature equal to or higher than the melting point of the target material. Hereinafter, using an example where the target material 270 is tin, the operation of the target supply device 7A will be described.

As shown in FIG. 6, the target supply device may have the same configuration as the target supply device 7A according to Embodiment 1, except that a target generator 8P, a filter 721P and a holder 741P are included instead of the target generator 8A, the filter part 72A and the positioning part 74A, and the support part 73A is not included. The target generator 8P may include a nozzle 82P with a nozzle hole 854P and be configured to accommodate the target material 270. The diameter of the nozzle hole 854P may be 1 μm to 3 μm. The holder 741P may be formed in an approximately annular shape. The filter 721P may be made of a porous material like, for example, the first filter 721A. The filter 721P may include an enormous number of through-pores each having a bore diameter of equal to or more than 3 μm and equal to or less than 20 μm and bending in different directions. The filter 721P may be held by the holder 741P so as to close a through-hole 821P of the nozzle 82P.

In this target supply device, the target material 270 may be accommodated in the target generator 8P and through-pores of the filter 721P and the through-hole 821P of the nozzle 82P may be filled with the target material 270. The target controller 71A may send a signal to the temperature controller 78A to heat the target material 270 in the target generator 8P to a predetermined temperature equal to or higher than the melting point of the target material 270.

In this case, broken pieces of the filter 721P may be generated and clog the nozzle hole 854P. Since the bore diameter of each of the through-pores of the filter 721P is greater than the diameter of the nozzle hole 854P, when the size of each particle 279P contained in the target material 270 is smaller than the bore diameter of the through-pores of the filter 721P but greater than the diameter of the nozzle hole 854P, the particles 279P may not be collected by the filter 721P but clog the nozzle hole 854P.

In order to collect the particles 279P which are too small to be collected by the filter 721P, it is conceivable that a plurality of capillaries made of glass which contains lead and has a low melting point are used to form a filter, in the same way as the third filter 723A according to Embodiment 1. The filter formed as described above may collect the particles 279P that cannot be collected by the filter 721P. However, as described above, lead contained in the glass having a low melting point which makes the filter reacts with tin as the target material 270, and therefore new particles of such as SnO, $SnO_2$ and $SiO_2$ may be produced from the inner surfaces of the through-holes of the filter. These produced particles may clog the nozzle hole 854P. In order to prevent this problem, the third filter 723A of the target supply device 7A may be configured as shown in FIGS. 3 to 5.

In the target supply device 7A shown in FIGS. 3 to 5, the target material 270 may be accommodated in the target generator 8A, and the through-pores of the first and second filters 721A and 722A, the first through-holes 724A of the third filter 723A, the second through-holes 732A of the support plate 731A, the through-hole 833A and the through-hole 853A may be filled with the target material 270. The target controller 71A may heat the target material 270 to a predetermined temperature equal to or higher than the melting point of the target material 270. When the target material 270 is tin, the predetermined temperature of the target material 270 which is equal to or higher than the melting point of the target material 270 may be equal to or higher than 232 degrees Celsius. The target controller 71A may send a signal at a predetermined frequency to the piezoelectric element 791A. By this means, the piezoelectric element 791A may vibrate to periodically generate the droplet 27 from the jet 27A.

The target controller 71A may send a signal to the pressure controller 762A to set the pressure in the target generator 8A to a target pressure Pt. The target pressure Pt may be equal to or greater than 10 MPa. The pressure controller 762A may control the opening and closing of the first valve V1 and the second valve V2 to reduce a difference AP between a pressure P measured by the pressure sensor 763A and the target pressure Pt. By this means, the inert gas in the inert gas bomb 761A may be supplied into the target generator 8A, so that the pressure in the target generator 8A may be stabilized at the target pressure Pt. When the pressure in the target generator 8A reaches the target pressure Pt, the jet 27A may be outputted from the nozzle 82A, and the droplet 27 may be generated according to the vibration of the nozzle 82A.

When the droplet 27 is outputted from the nozzle 82A, the target material 270 in the accommodating space 810A may pass through the first filter 721A. When the target material 270 passes through the first filter 721A, the first filter 721A may collect particles each having a diameter greater than the bore diameter of each of the through-pores of the first filter 721A. The target material 270 having passed through the first filter 721A may pass through the second filter 722A. When the target material 270 passes through the second filter 722A, the second filter 722A may collect particles each having a diameter greater than the bore diameter of each of the through-pores of the second filter 722A. The target material 270 having passed through the second filter 722A may pass through the third filter 723A. When the target material 270 passes through the third filter 723A, the third filter 723A may collect particles each having a diameter greater than the bore diameter of each of the first through-holes 724A.

The third filter 723A may collect broken pieces of the first filter 721A and the second filter 722A. The third filter 723A may collect particles each having a diameter smaller than the bore diameter of each of the through-pores of the first filter 721A and the second filter 722A and greater than the diameter of the nozzle hole 854A. When the target material 270 passes through the third filter 723A, the coating film 725A may prevent the reaction between tin as the target material 270 and lead contained in the inner surfaces of the first through-holes 724A of the third filter 723A. As a result, it is possible to prevent the production of new particles of such as SnO, $SnO_2$, and $SiO_2$, from the inner surfaces of the first through-holes 724A of the third filter 723A. Therefore, it is possible to prevent the nozzle hole 854A from being clogged.

The support plate 731A may abut on the entire surface of the third filter 723A in the nozzle hole 854A side so as to support the third filter 723A. By this means, even when the target pressure Pt is applied to the third filter 723A, it is possible to prevent the third filter 723A from being damaged. The target material 270 having passed through the third filter 723A may pass through the second through-holes 732A of the support plate 731A and be outputted from the nozzle hole 854A.

3.3 Embodiment 2

3.3.1 Configuration

Figure 7:
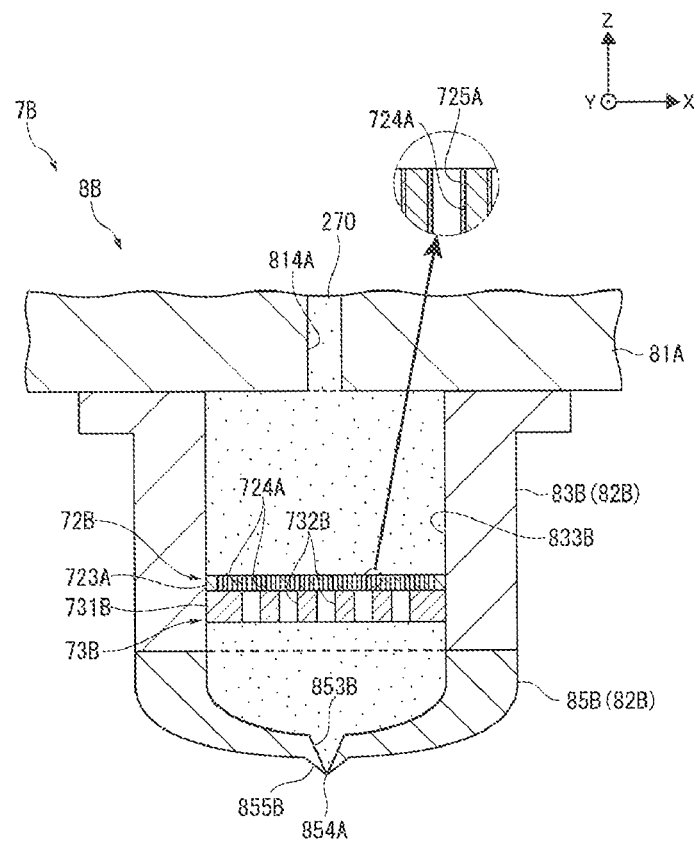
FIG. 7 schematically shows the configuration of primary parts of the target supply device according to Embodiment 2.

FIG. 7 schematically shows the configuration of primary parts of the target supply device according to Embodiment 2. The same components as in the target supply device 7A according to Embodiment 1 may be applied to a target supply device 7B according to Embodiment 2, except for a target generator 8B, a filter part 72B and a support part 73B.

As shown in FIG. 7, the target generator 8B may include the tank 81A, a nozzle base part 83B, and a nozzle tip part 85B. The nozzle base part 83B and the nozzle tip part 85B may be made of glass containing, for example, lead and having a low melting point, like the third filter 723A. The nozzle base part 83B may be formed in an approximately cylindrical shape. The first surface of the nozzle base part 83B in the +Z direction side may be connected to the surface of the tank 81A in the −Z direction side. In this case, a through-hole 833B of the nozzle base part 83B may communicate with the through-hole 814A of the tank 81A. The inside diameter of the through-hole 833B may be approximately the same as the outside diameter of the third filter 723A. The nozzle tip part 85B may be formed in an approximately cylindrical shape having the second surface as a wall surface in the −Z direction side. The outside diameter and inside diameter of the nozzle tip part 85B may be approximately the same as those of the nozzle base part 83B. A frusto-conical protrusion 855B may be formed in the center of the wall surface of the nozzle tip part 85B in the −Z direction side. The protrusion 855B may be provided to facilitate the concentration of an electric field on the protrusion 855B. A through-hole 853B penetrating the nozzle tip part 85B in the Z-axis direction may be provided in the center of the wall surface of the nozzle tip part 85B in the −Z direction side. The through-hole 853B may be formed in a conical shape such that the diameter of the through-hole 853B is reduced in the −Z direction. The opening of the through-hole 853B in the −Z direction side, which is located in the center of the tip part of the protrusion 855B, may constitute the nozzle hole 854A. The nozzle base part 83B and the nozzle tip part 85B may constitute the nozzle 82B.

The filter part 72B may be constituted of only the third filter 723A. The third filter 723A may be made of glass containing lead and having a low melting point. The outer periphery of the third filter 723A may be welded to the inner periphery of the nozzle base part 83B. The support part 73B may include a support plate 731B having the same shape as the support plate 731A. The support plate 731B may be a support member according to the present disclosure. The support plate 731B may include second through-holes 732B that are provided in the same way as the second through-holes 732A. The support plate 731B may be made of glass containing lead and having a low melting point, like the third filter 723A. The outer periphery of the support plate 731B may be welded to the inner periphery of the nozzle base part 83B. The support plate 731B may abut on the entire surface of the third filter 723A in the nozzle hole 854A side so as to support the third filter 723A. The first through-holes 724A of the third filter 723A may communicate with the second through-holes 732B of the support plate 731B. The fusion-welded portion between the third filter 723A and the nozzle base part 83B, and the fusion-welded portion between the support plate 731B and the nozzle base part 83B may be positioning parts according to the present disclosure.

The surfaces of the nozzle base part 83B, the nozzle tip part 85B, the third filter 723A, and the support plate 731B, which contact the liquid target material 270, may be coated with a material which is not easy to react with the liquid target material 270. The material which is not easy to react with the liquid target material 270 may be any of the materials listed in Table 6 shown above.

3.3.2 Operation

Now, the operation of the target supply device 7B will be described. Hereinafter, the same operation as in Embodiment 1 will not be described again.

In the target supply device 7B shown in FIG. 7, the target material 270 may be accommodated in the target generator 8B, and the inside of the nozzle base part 83B, the first through-holes 724A of the third filter 723A, the second through-holes 732B of the support plate 731B, and the inside of the nozzle tip part 85B maybe filled with the target material 270. The target controller 71A may heat the target material 270 to a predetermined temperature equal to or higher than the melting point of the target material 270, and adjust the pressure in the target generator 8B to generate the droplet 27.

When the droplet 27 is outputted from the nozzle 82B, the target material 270 in the target generator 8B may pass through the third filter 723A. When the target material 270 passes through the third filter 723A, the third filter 723A may collect particles each having a diameter greater than the bore diameter of each of the first through-holes 724A.

When the target material 270 passes through the third filter 723A, the coating film 725A may prevent the reaction between tin as the target material 270 and lead contained in the inner surfaces of the first through-holes 724A of the third filter 723A. When the target material 270 passes through the nozzle base part 83B, the second through-holes 732B of the support plate 731B, and the nozzle tip part 85B, the coating film that is not easy to react with the liquid target material 270 may prevent the target material 270 from reacting with lead contained in the nozzle base part 83B, the second through-holes 732B of the support plate 731B, and the nozzle tip part 85B. As a result, it is possible to prevent the production of new particles of such as SnO, $SnO_2$ and $SiO_2$ from the nozzle base part 83B, the first through-holes 724A of the third filter 723A, the second through-holes 732B of the support plate 731B, and the nozzle tip part 85B. Therefore, it is possible to prevent the nozzle hole 854A from being clogged.

The support plate 731B may abut on the entire surface of the third filter 723A in the nozzle hole 854A side so as to support the third filter 723A. By this means, even when the target pressure Pt is applied to the third filter 723A, it is possible to prevent the third filter 723A from being damaged. The nozzle base part 83B, the nozzle tip part 85B, the third filter 723A and the support plate 731B are made of glass having a low melting point. Therefore, it is possible to more effectively prevent the production of particles than when the nozzle base part 83B, the nozzle tip part 85B, the third filter 723A and the support plate 731B are made of molybdenum. The nozzle tip part 85B is made of glass having a low melting point, and therefore the diameter of the nozzle hole 854A can be smaller than when the nozzle tip part 85B is made of molybdenum.

3.4 Embodiment 3

3.4.1 Configuration

Figure 8:
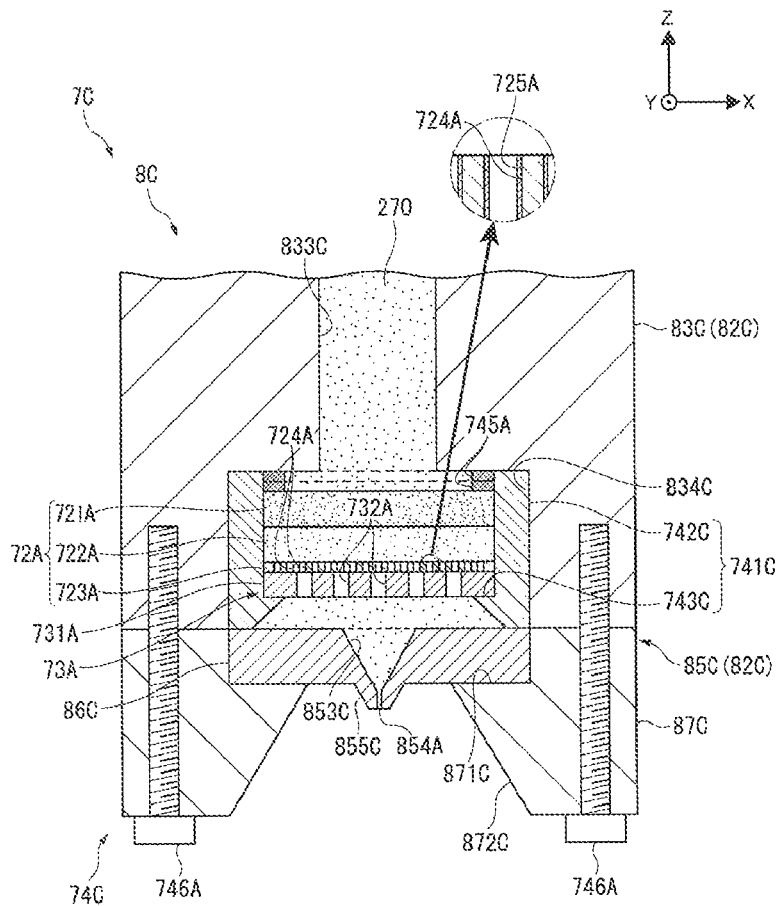
FIG. 8 schematically shows the configuration of primary parts of the target supply device according to Embodiment 3.

FIG. 8 schematically shows the configuration of primary parts of the target supply device according to Embodiment 3. The same components as in the target supply device 7A according to Embodiment 1 may be applied to a target supply device 7C according to Embodiment 3, except for a target generator 8C and a positioning part 74C.

As shown in FIG. 8, the target generator 8C may include a tank (not shown), a nozzle base part 83C and a nozzle tip part 85C. The nozzle base part 83C, and an output part 86C and a fixing member 87C (described later) of the nozzle tip part 85C may be made of a material, for example, molybdenum which has a low reactivity with the target material 270. The nozzle base part 83C may be formed in an approximately cylindrical shape. The first surface of the nozzle base part 83C in the +Z direction side may be fixed to the surface of the tank in the −Z direction side. Alternatively, the nozzle base part 83C may be formed integrally with the tank. In this case, a through-hole 833C of the nozzle base part 83C may communicate with the tank. An accommodating part 834C may be located in the −Z direction side of the through-hole 833C. A holder 741C (described later) of the positioning part 74C maybe accommodated in the accommodating part 834C.

The nozzle tip part 85C may include the output part 86C and the fixing member 87C. The output part 86C may be formed as an approximately circular plate. The output part 86C may be fixed by the fixing member 87C so as to adhere tightly to the end surface of the positioning part 74C. The output part 86C may be provided with a protrusion 855C and a through-hole 853C which have the same configurations of the protrusion 855B and the through-hole 853B, respectively. The opening of the through-hole 853C in the −Z direction side may constitute the nozzle hole 854A. The nozzle base part 83C and the nozzle tip part 85C may constitute the nozzle 82C.

The fixing member 87C may be formed in an approximately cylindrical shape, and have a flat surface with an outside diameter approximately the same as the outside diameter of the nozzle base part 83C. A concave portion 871C may be provided in the upper surface of the fixing member 87C. A cone-shaped hole 872C penetrating the fixing member 87C of the nozzle tip part 85C in the vertical direction may be provided in the center of the fixing member 87C. The cone-shaped hole 872C may be formed in a conical shape having a diameter that increases in the −Z direction. The output part 86C may be accommodated in the concave portion 871C of the fixing member 87C such that the protrusion 855C is placed inside the cone-shaped hole 872C.

The positioning part 74C may position the filter part 72A and the support part 73A in the target generator 8C. The positioning part 74C may include a holder 741C, the shim 745A and the bolts 746A. The holder 741C may include a tubular part 742C and an abutting part 743C. The first surface of the holder 741C in the +Z direction side and the second surface of the holder 741C in the −Z direction side may be polished. The part of the holder 741C in the −Z direction side may be formed in a conical shape having a diameter that increases in the −Z direction. The holder 741C may be accommodated in the accommodating part 834C of the nozzle base part 83C. The support plate 731A may be accommodated in the holder 741C. The support plate 731A may be placed on the abutting part 743C of the holder 741C. In the holder 741C, the first, second, and third filters 721A, 722A, and 723A, and the two shims 745A may be stacked on the support plate 731A in the +Z direction side.

The bolts 746A may penetrate the fixing member 87C and be threadably engaged with the nozzle base part 83C. By this means, it is possible to provide sealing between the output part 86C and the holder 741C, between the support plate 731A and the abutting part 743C, between the shim 745A in the −Z direction side and the first filter 721A, between the plurality of shims 745A, and between the shim 745A in the +Z direction side and the nozzle base part 83C. The support plate 731A abuts on the entire surface of the third filter 723A in the nozzle hole 854A side so as to be able to support the third filter 723A. The first through-holes 724A of the third filter 723A may communicate with the second through-holes 732A of the support plate 731A.

3.4.2 Operation

Now, the operation of the target supply device 7C will be described. Hereinafter, the same operation as in Embodiment 1 will not be described again.

In the target supply device 7C shown in FIG. 8, the target material 270 may be accommodated in the target generator 8C, and the through-pores of the first and second filters 721A and 722A, the first through-holes 724A of the third filter 723A, the second through-holes 732A of the support plate 731A, the through-hole 833C and the through-hole 853C may be filled with the target material 270. The target controller 71A may heat the target material 270 to a predetermined temperature equal to or higher than the melting point of the target material 270, and adjust the pressure in the target generator 8C to generate the droplet 27.

When the droplet 27 is outputted from the nozzle 82C, the target material 270 in the target generator 8C may pass through the first, second, and third filters 721A, 722A and 723A. When the target material 270 passes through the third filter 723A, the third filter 723A may collect particles each having a diameter greater than the bore diameter of each of the first through-hole 724A.

When the liquid target material 270 flows through the space between the filter part 72A and the nozzle hole 854A, particles may be produced due to the abrasion of the target material 270 caused by the friction of the target material 270 against the support plate 731A, the holder 741C and the output part 86C which constitute the space. The output part 86C having the nozzle hole 854A may contact the holder 741A accommodating the filter part 72A, and therefore the space between the filter part 72A and the nozzle hole 854A can be smaller than the configuration according to Embodiment 1. As a result, it is possible to more effectively prevent the production of particles in the space between the filter part 72A and the nozzle hole 854A than the configuration according to Embodiment 1.

3.5 Embodiment 4

3.5.1 Configuration

Figure 9:
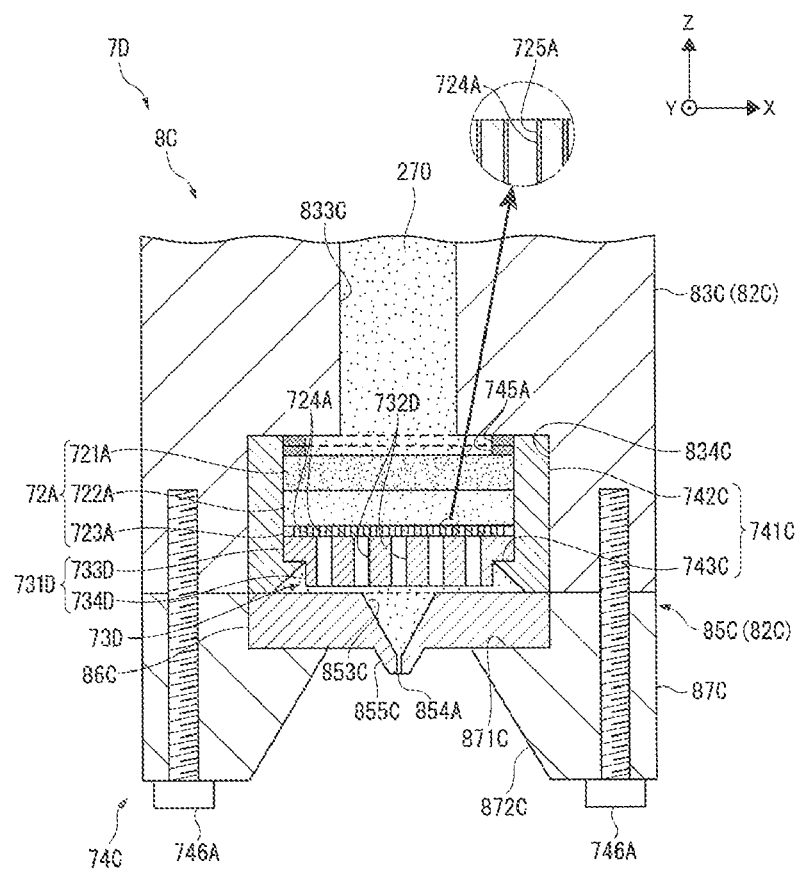
FIG. 9 schematically shows the configuration of primary parts of the target supply device according to Embodiment 4.

FIG. 9 schematically shows the configuration of primary parts of the target supply device according to Embodiment 4. The same components as in the target supply device 7C according to Embodiment 3 maybe applied to a target supply device 7D according to Embodiment 4, except for a support part 73D.

The support part 73D may include a support plate 731D. The support plate 731D may be a support member according to the present disclosure. The support plate 731D may include a circular plate part 733D. The circular plate part 733D may be formed as an approximately circular plate having approximately the same shape as the support plate 731A according to Embodiment 3. A convex portion 734D formed as an approximately circular plate may be provided on the second surface of the circular plate part 733D in the −Z direction side. The outside diameter of the convex portion 734D may be smaller than the outside diameter of the circular plate part 733D. The support plate 731D may include second through-holes 732D that are provided in the same way as the second through-holes 732A. The support plate 731D may be made of quartz glass having a low reactivity with the target material 270. The support plate 731D may include the second through-holes 732D penetrating the support plate 731D in the Z-axis direction, i.e., the thickness direction. The number of the second through-holes 732D may be smaller than the number of the first through-holes 724A. The bore diameter of the second through-hole 732D may be approximately the same as the bore diameter of the second through-hole 732A according to Embodiment 3.

The support plate 731D may be accommodated in the holder 741C. The second surface of the circular plate part 733D of the support plate 731D in the −Z direction side may be placed on the abutting part 743C of the holder 741C. The convex portion 734D of the support plate 731D may be located in the −Z direction side with respect to the abutting part 743C, and located in the +Z direction side with respect to the second surface of the tubular part 742C in the −Z direction side. In the holder 741C, the first, second and third filters 721A, 722A, and 723A, and two shims 745A may be stacked on the support plate 731D in the +Z direction side. When the bolts 746A penetrate the fixing member 87C and are threadably engaged with the nozzle base part 83C, it is possible to seal between the support plate 731D and the abutting part 743C. The support plate 731D may abut on the entire surface of the third filter 723A in the nozzle hole 854A side so as to be able to support the third filter 723A. The first through-holes 724A of the third filter 723A may communicate with the second through-holes 732D of the support plate 731D.

3.5.2 Operation

Now, the operation of the target supply device 7D will be described. Hereinafter, the same operation as in Embodiment 3 will not be described again.

In the target supply device 7D shown in FIG. 9, the target material 270 may be accommodated in the target generator 8C, and the through-pores and the first through-holes 724A of the filter part 72A, the second through-holes 732D of the support plate 731D, the through-hole 833C, and the through-hole 853C may be filled with the target material 270. The target controller 71A may heat the target material 270 to a predetermined temperature equal to or higher than the melting point of the target material 270, and adjust the pressure in the target generator 8C to generate the droplet 27.

When the droplet 27 is outputted from the nozzle 82C, the target material 270 in the target generator 8C may pass through the filter part 72A and the support plate 731D. When the liquid target material 270 flows through the space between the filter part 72A and the nozzle hole 854A, particles may be produced due to the abrasion of the target material 270 caused by the friction of the target material 270 against the support plate 731D, the holder 741C and the output part 86C which constitute the space. In a case in which the support plate 731D is made of quartz glass, the support plate 731D may not be easy to be abraded, as compared to when the support plate 731D is made of molybdenum, because the surface of quartz glass is smoother than the surface of molybdenum. As a result, it is possible to more effectively prevent the production of particles due to the abrasion of the target material 270 caused by the friction of the target material 270 against the support plate 731D than the configuration according to Embodiment 3. The thickness of the support plate 731D is greater than the thickness of the support plate 731A according to Embodiment 3, and therefore it is possible to prevent the support plate 731D made of quartz glass from being damaged.

3.6 Embodiment 5

3.6.1 Configuration

Figure 10:
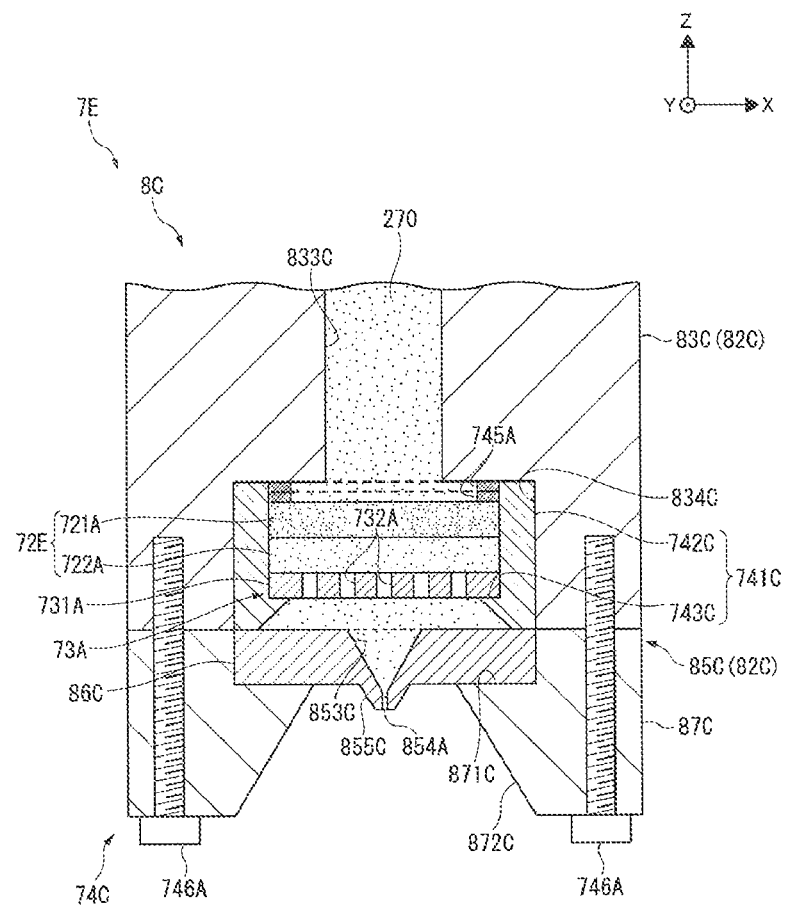
FIG. 10 schematically shows the configuration of primary parts of the target supply device according to Embodiment 5.

FIG. 10 schematically shows the configuration of primary parts of the target supply device according to Embodiment 5. The same components as in the target supply device 7C according to Embodiment 3 may be applied to a target supply device 7E according to Embodiment 5, except for a filter part 72E. The filter part 72E may include the first filter 721A and the second filter 722A, but not include the third filter 723A. In this case, the second filter 722A may be a filter according to the present disclosure. The support plate 731A may be accommodated in the holder 741C. The support plate 731A may be placed on the abutting part 743C of the holder 741C. In the holder 741C, the first and second filters 721A and 722A, and the two shims 745A may be stacked on the support plate 731A in the +Z direction side. When the bolts 746A are threadably engaged with the nozzle base part 83C, it is possible to seal between the support plate 731A and the abutting part 743C. The support plate 731A may abut on the entire surface of the second filter 722A in the nozzle hole 854A side so as to be able to support the second filter 722A. The through-pores of the second filter 722A may communicate with the second through-holes 732A of the support plate 731A.

3.6.2 Operation

Now, the operation of the target supply device 7E will be described. Hereinafter, the same operation as in Embodiment 3 will not be described again.

In the target supply device 7E shown in FIG. 10, the target material 270 may be accommodated in the target generator 8C, and the through-pores of the first and second filters 721A and 722A, the second through-holes 732A of the support plate 731A, the through-hole 833C, and the through-hole 853C may be filled with the target material 270. The target controller 71A may heat the target material 270 to a predetermined temperature equal to or higher than the melting point of the target material 270, and adjust the pressure in the target generator 8C to generate the droplet 27. The support plate 731A may abut on the entire surface of the second filter 722A in the nozzle hole 854A side so as to support the second filter 722A. Therefore, even when a pressure to generate the droplet 27 is applied to the second filter 722A, it is possible to prevent the second filter 722A from being damaged.

3.7 Embodiment 6

3.7.1 Configuration

Figure 11:
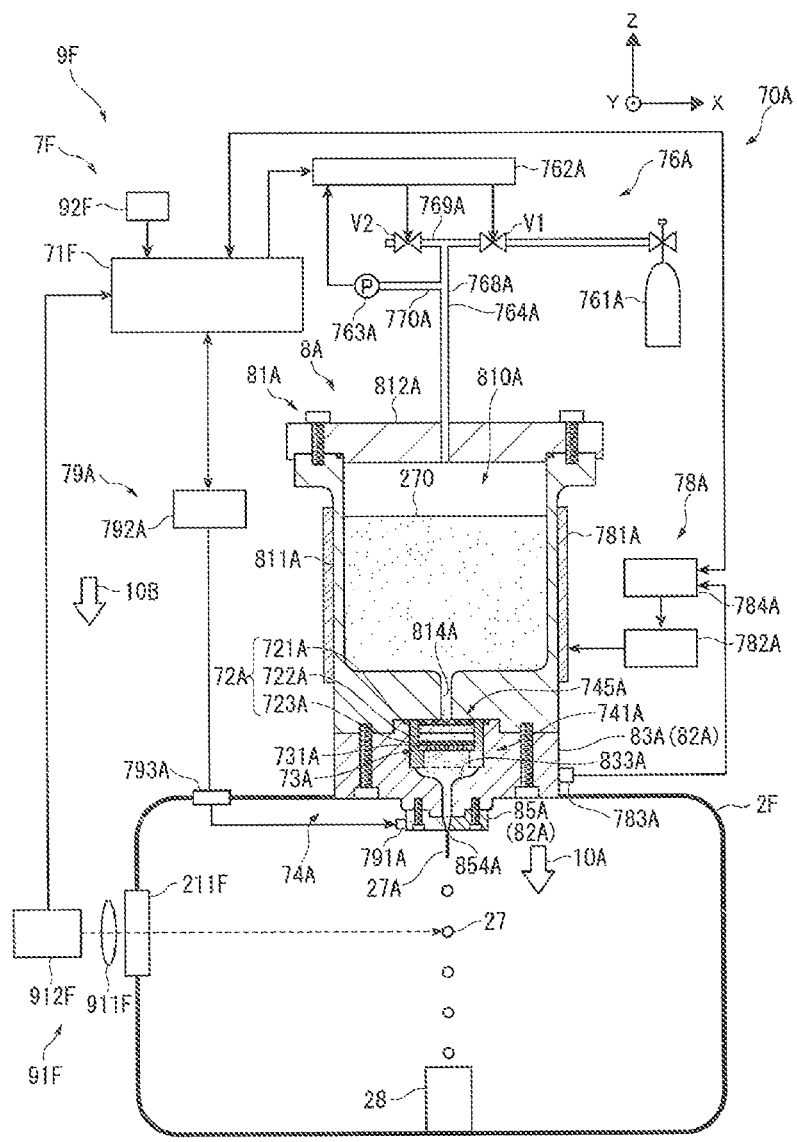
FIG. 11 schematically shows the configuration of a filter damage prevention device including the target supply device according to Embodiment 6.

FIG. 11 schematically shows the configuration of a filter damage prevention device including the target supply device according to Embodiment 6.

As shown in FIG. 11, a filter damage prevention device 9F may include a chamber 2F, a target supply device 7F, an imaging part 91F and a timer 92F. The target collector 28 may be provided on the wall of the chamber 2F in the −Z direction side. A circular window 211F may be provided on the wall of the chamber 2F in −X direction side. The target supply device 7F may include the target generation part 70A and a target controller 71F. The target generator 8A of the target generation part 70A may be provided to penetrate the wall of the chamber 2F in the +Z direction side and face the target collector 28. The target generator 8A may be provided such that the tank 81A and the nozzle base part 83A are located outside the chamber 2F and the nozzle tip part 85A is located inside the chamber 2F. The pressure controller 762A, the temperature controller 784A, the power source 792A, and a camera 912F (described later) of the imaging part 91F may be electrically connected to the target controller 71F.

The imaging part 91F may include a lens 911F and the camera 912F. The lens 911F may be provided outside the window 211F of the chamber 2F. The lens 911F may be provided such that the axis of the lens 911F matches the axis of the window 211F. The camera 912F may be a CCD camera. The camera 912F may be provided to be able to capture the image of the droplet 27 outputted from the nozzle hole 854A via the lens 911F and the window 211F. The camera 912F may send a signal corresponding to the captured image to the target controller 71F.

The timer 92F may be electrically connected to the target controller 71F. The timer 92F may measure time, and send a signal corresponding to the measured time to the target controller 71F. The timer 92F may be a clock to measure the current time, or a stopwatch to measure the amount of time elapsed from the start of the operation of the timer 92F.

3.7.2 Operation

Figure 12:
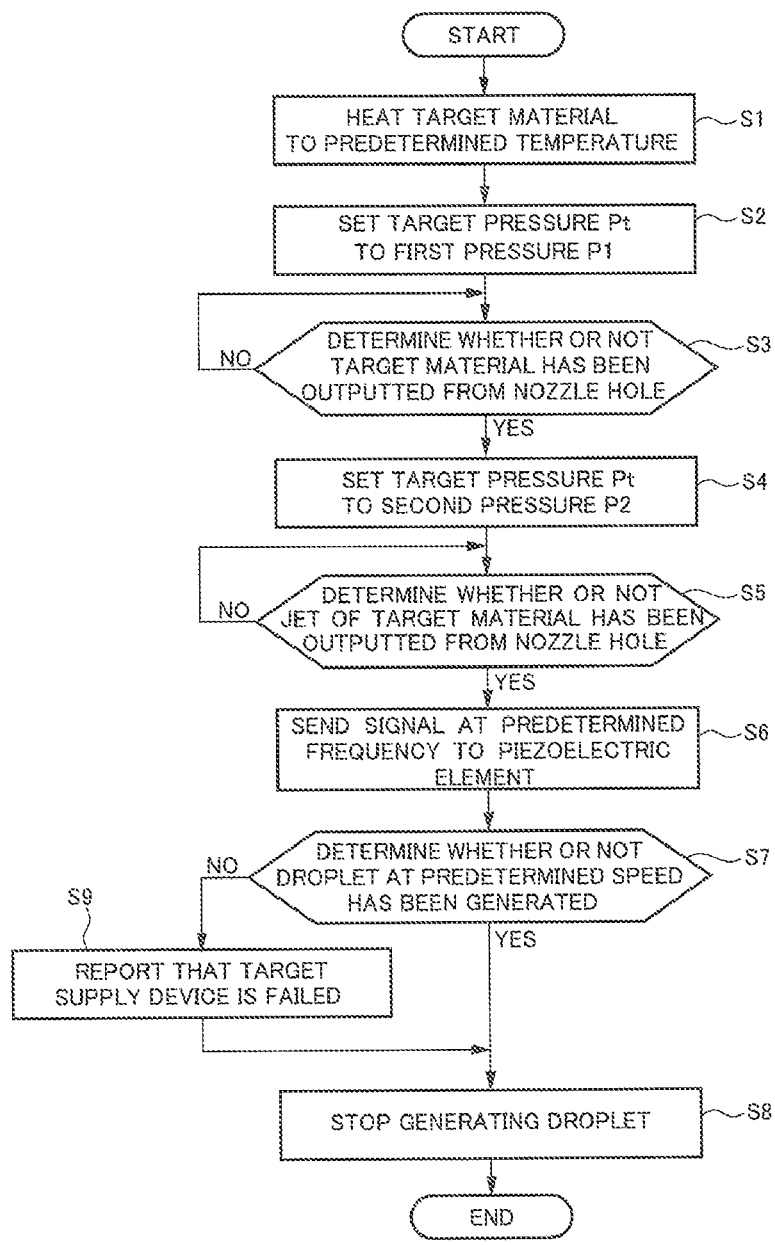
FIG. 12 is a flowchart showing a method of preventing filter damage.
Figure 13:
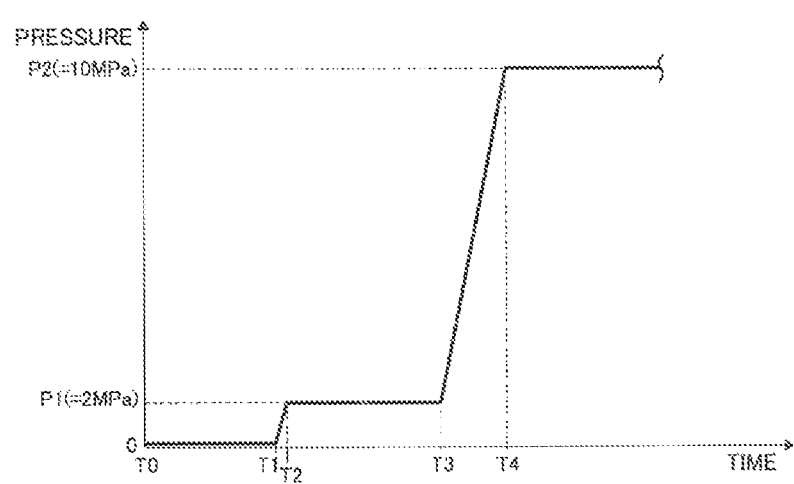
FIG. 13 is a timing chart showing the method of preventing filter damage, which is performed in the filer damage prevention device.
Figure 14:
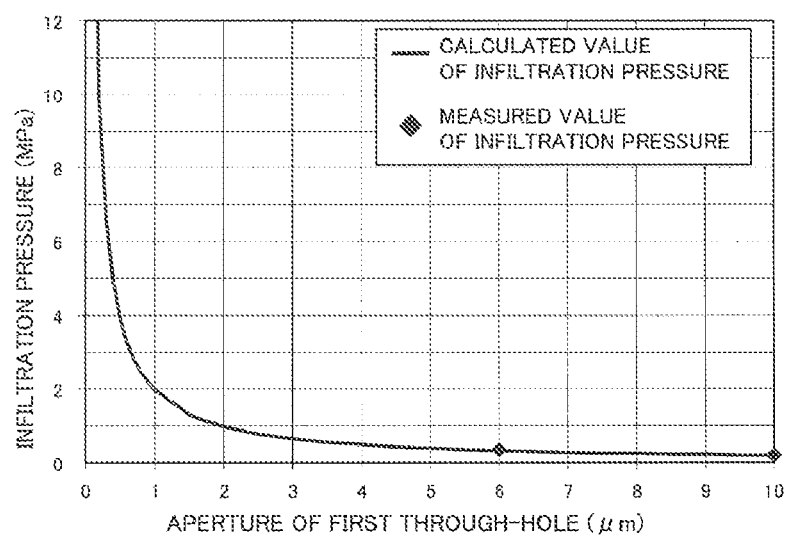
FIG. 14 is a chart showing the relationship between the infiltration pressure and the bore diameter of a first through-hole of the third filter.

FIG. 12 is a flowchart showing a method of preventing filter damage. FIG. 13 is a timing chart showing the method of preventing filter damage performed in the filter damage prevention device. FIG. 14 is a chart showing the relationship between the bore diameter of each of the first through-holes of the third filter and the infiltration pressure. With the operation described later, the target controller 71F may receive the signal sent from the timer 92F, and determine the time based on the received signal.

In the filter damage prevention device 9F shown in FIG. 11, the target material 270 may be accommodated in the target generator 8A. In this case, the through-pores of the first and second filters 721A and 722A, the first through-holes 724A of the third filter 723A, the second through-holes 732A of the support plate 731A, the through-hole 833A and the through-hole 835A may not be filled with the target material 270. The pressure in the target generator 8A may be the atmospheric pressure. Here, in FIG. 11, the first and second through-holes, and the through-hole are not assigned reference numerals and characters 724A, 732A, and 853A, respectively.

As shown in FIG. 12, the target controller 71F may heat the target material 270 to a predetermined temperature equal to or higher than the melting point of the target material 270 (step S1). The process in the step S1 may be performed at time T0 shown in FIG. 13. When the target material 270 is tin, the predetermined temperature equal to or higher than the melting point of the target material 270 may be equal to or higher than 232 degrees Celsius, and, for example, may be 240 to 270 degrees Celsius. When determining that the temperature of the target material 270 is stabilized at the predetermined temperature, the target controller 71F may set the target pressure Pt in the target generator 8A to a first pressure P1 (step S2) as shown in FIG. 12. The process in the step S2 may be performed at time T1 shown in FIG. 13. The first pressure P1 may provide an amount of force that can infiltrate tin as the target material 270 into the through-holes 724A of the third filter 723A. The first pressure P1 may be set based on the relationship shown in FIG. 14. Based on the surface tension of tin as the target material 270, the infiltration pressure of the target material 270 maybe calculated under the condition that each of the first through-holes 724A having the coating film 725A has a predetermined bore diameter. As shown in FIG. 14, the calculated value of the infiltration pressure may approximately match the measured value of the infiltration pressure. The first pressure P1 maybe set according to the bore diameter of the first through-hole 724A, based on the relationship shown in FIG. 14. For example, when the bore diameter of the first through-hole 724A is 1 μm, the first pressure P1 may be set to 2 MPa. In addition, when the bore diameter of the first through-hole 724A is 0.5 μm, the first pressure P1 may beset to 4 MPa. When the bore diameter of the first through-hole 724A is 2 μm, the first pressure P1 may be set to 1 MPa.

When the pressure in the target generator 8A is stabilized at the first pressure P1, the liquid target material 270 accommodated in the target generator 8A may pass through the through-pores of the first and second filters 721A and 722A, and infiltrate into the first through-holes 724A of the third filter 723A. The target material 270 having infiltrated into the first through-holes 724A may pass through the first through-holes 724A, the second through-holes 732A of the support plate 731A, the through-hole 833A and the through-hole 853A, and be outputted from the nozzle hole 854A. As a result, the through-pores of the first and second filters 721A and 722A, the first through-holes 724A of the third filter 723A, the second through-holes 732A of the support plate 731A, the through-hole 833A and the through-hole 853A may be filled with the target material 270. As shown in FIG. 12, the target controller 71F may receive a signal from the camera 912F, and determine whether or not the target material 270 has been outputted from the nozzle hole 854A (step S3). The process in the step S3 may be performed after the time T2 shown in FIG. 13, or performed at the time between the time T1 and the time T2. As shown in FIG. 12, when determining that the target material 270 has not been outputted from the nozzle hole 854A in the step S3, the target controller 71F may perform the process in the step S3 again after a predetermined period of time has elapsed. On the other hand, when determining that the target material 270 has been outputted from the nozzle hole 854A in the step S3, the target controller 71F may set the target pressure Pt in the target generator 8A to a second pressure P2 (step S4). The process in the step S4 may be performed at time T3 in FIG. 13. The second pressure P2 may provide an amount of force to output the target material 270 from the nozzle hole 854A as the jet 27A. When the target material 270 is tin, and the speed of the jet 27A is 50 m/s to 100 m/s, the second pressure P2 may be 10 MPa to 20 MPa.

When the pressure in the target generator 8A is stabilized at the second pressure P2, the liquid target material 270 accommodated in the target generator 8A may be outputted from the nozzle hole 854A as the jet 27A. As shown in FIG. 12, the target controller 71F may receive a signal from the camera 912F, and determine whether or not the jet 27A has been outputted from the nozzle hole 854A (step S5). The process in the step S5 may be performed after time T4 in FIG. 13, or performed at the time between the time T3 and the time T4. As shown in FIG. 12, when determining that the jet 27A has not been outputted from the nozzle hole 854A in the step S5, the target controller 71F may perform the process in the step S5 again after a predetermined period of time has elapsed. On the other hand, when determining that the jet 27A has been outputted from the nozzle hole 854A in the step S5, the target controller 71F may send a signal at a predetermined frequency to the piezoelectric element 791A (step S6). By this means, the piezoelectric element 791A may vibrate to periodically generate the droplet 27 from the jet 27A.

The target controller 71F may receive a signal from the camera 912F, and determine whether or not the droplet 27 at a predetermined speed has been generated (step S7). The processes in the step S6 and the step S7 may be performed after the time T4 shown in FIG. 13. The target controller 71F may measure, for example, the speed and the diameter of the droplet 27, and determine whether or not the droplet 27 at a predetermined speed has been generated. As shown in FIG. 12, when determining that the droplet 27 at a predetermined speed has been generated in the step S7, the target controller 71F may stop generating the droplet 27 (step S8). In the step S8, for example, the target controller 71F may stop sending the signal to the piezoelectric element 791A, and bring the pressure in the target generator 8A back to the atmospheric pressure. The target controller 71F may stop heating the target material 270 in the target generator 8A, and solidify the target material 270. In this case, the target material 270 filled in the through-pores of the first and second filters 721A and 722A, the first through-holes 724A of the third filter 723A, the second through-holes 732A of the support plate 731A, the through-hole 833A and the through-hole 853A may be solidified. When the process in the step S8 is performed without the process in step S9 (described later), the target supply device 7F having the solidified target material 270 may be removed from the chamber 2F, and mounted in, for example, the chamber 2 of the EUV light generation apparatus 1A as shown in FIG. 2.

On the other hand, when determining that the droplet 27 at a predetermined speed has not been generated in the step S7, the target controller 71F may report that the target supply device 7F is failed to the outside (step S9) and perform the process in the step S8. When the process in the step S8 is performed after performing the process in the step S9, maintenance may be done on the target supply device 7F with the solidified target material 270 to recover the target supply device 7F.

As described above, when the third filter 723A including the first through-holes 724A not filled with the target material 270 is used, first, the minimum pressure that allows the target material 270 to be infiltrated into the first through-holes 724A may be applied to the target material 270. Therefore, it is possible to fill the first through-holes 724A with the target material 270 while preventing the third filter 723A from being damaged. The pressure that provides the amount of force to output the target material 270 as the jet 27A is applied to the target material 270 after the first through-holes 724A are filled with the target material 270. Therefore, the difference in the pressure between the opening of each of the first through-holes 724A in the +Z direction side and the opening of each of the first through-holes 724A in the −Z direction side may be reduced, and consequently it is possible to prevent the third filter 723A from being damaged.

3.8 Embodiment 7

In order to reduce debris due to plasma generation, there is a demand for the target supply device to reduce the diameter of the droplet 27 to be outputted. In order to reduce the diameter of the droplet 27, the diameter of the nozzle hole 854A may also need to be reduced. In addition to this, the bore diameter of each of the first through-holes 724A of the third filter 723A may also need to be reduced. In this case, when the bore diameter of each of the first through-holes 724A of the third filter 723A is simply reduced, the pressure loss of the target material 270 passing through the third filter 723A may be increased, and therefore a stress generated in the third filter 723A may be increased. Therefore, it is desired that the bore diameter of each of the first through-holes 724A of the third filter 723A is reduced and the number of the first through-holes 724A is increased. However, this may lead to reduce the strength of a pressure receiving surface of the third filter 723A itself per unit area. Therefore, it is conceivable that, in order to reinforce the third filter 723A, the third filter 723A including an increased number of the first through-holes 724A each of which has a smaller bore diameter is supported by the support plate 731A, in the same way as the above-described embodiments. An appropriate bore diameter and an appropriate number of the second through-holes 732A of the support plate 731A may be determined based on the bore diameter and number of the first-through-holes 724A of the third filter 723A. In association with the reduction in the bore diameter and the increase in the number of the first through-holes 724A of the third filter 723A, there may be need to reduce the bore diameter and increase the number of the second through-holes 732A of the support plate 731A. However, when the support plate 731A is made of a metallic material such as molybdenum which has a low reactivity with the target material 270, the bore diameter and number of the second through-holes 732A of the support plate 731A may be restricted in terms of its processability and cost. Therefore, it is desired to achieve a target supply device that can fulfill a demand to reduce the diameter of the droplet 27 to be outputted.

3.8.1 Configuration

Figure 15:
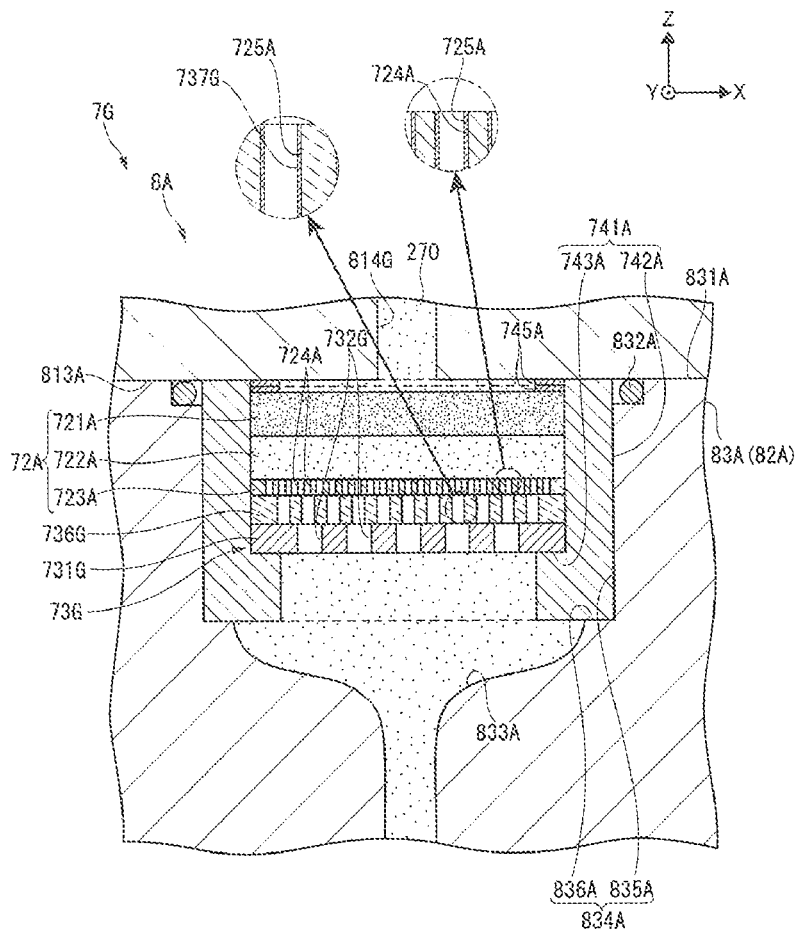
FIG. 15 schematically shows the configuration of primary parts of the target supply device according to Embodiment 7.

FIG. 15 schematically shows the configuration of primary parts of the target supply device according to Embodiment 7. The same components as in the target supply device 7A according to Embodiment 1 may be applied to a target supply device 7G according to Embodiment 7, except for a support part 73G.

The support part 73G may be constituted by two support plates. The support part 73G may include a support plate 731G and a support plate 736G. The support plate 731G and the support plate 736G may be support members according to the present disclosure.

The support plate 731G may be made of approximately the same material as the support plate 731A. The support plate 731G may be formed in approximately the same shape as the support plate 731A. The support plate 731G may include second through-holes 732G that are provided in the same way as the second through-holes 732A.

The support plate 736G may be formed by a plurality of capillaries like the third filter 723A. The capillaries forming the support plate 736G may be made of glass containing lead shown in Tables 3, 4, and 5, in the same way as the third filter 723A. Otherwise, the capillaries forming the support plate 736G may be made of quartz glass. The support plate 736G may be formed as an approximately circular plate like the third filter 723A, and have a diameter of about 20 mm which is approximately the same as the third filter 723A. The support plate 736G may include a number of second through-holes 737G penetrating the support plate 736G in the Z-axis direction, i.e., the thickness direction, in the same way as the first-through holes 724A of the third filter 723A. The number of the second through-holes 737G may be smaller than the number of the first through-holes 724A of the third filter 723A, and greater than the number of the second through-holes 732G of the support plate 731G. The bore diameter of each of the second through-holes 737G may be greater than the bore diameter of each of the first through-holes 724A of the third filter 723A, and smaller than the bore diameter of each of the second through-holes 732G of the support plate 731G. The bore diameter of the second through-hole 737G may be 0.1 mm to 0.8 mm. The support plate 736G may be formed by bundling and binding a plurality of capillaries having the second through-holes 737G, in the same way as the third filter 723A which is formed by bundling and binding a plurality of capillaries having the first through-holes 724A. The coating film 725A may be provided on the inner surfaces of the second through-holes 737G of the support plate 736G in the same way as the third filter 723A.

The support plate 731G and the support plate 736G may be accommodated in the holder 741A. Like the support plate 731A, the support plate 731G may be placed on the abutting part 743A of the holder 741A. The support plate 736G may be placed to abut on approximately the entire surface of the support plate 731G placed on the abutting part 743A in the +Z direction side. In the holder 741A, the first, second, and third filters 721A, 722A, and 723A, and the two shims 745A may be stacked on the support plate 736G in the +Z direction side, in the same way as the target supply device 7A according to Embodiment 1. The support plate 736G may abut on approximately the entire surface of the third filter 723A in the −Z direction side so as to support the third filter 723A accommodated in the holder 741A. The first through-holes 724A of the third filter 723A, the second through-holes 737G of the support plate 736G, and the second through-holes 732G of the support plate 731G may communicate with each other.

3.8.2 Operation

Now, the operation of the target supply device 7G will be described. Hereinafter, the same operation as in Embodiment 1 will not be described again.

In the target supply device 7G shown in FIG. 15, the target material 270 may be accommodated in the target generator 8A, and the through-pores and the first through-holes 724A of the filter part 72A, the second through-holes 732G and 737G of the support plates 731G and 736G, the through-hole 833A and the through-hole 853A may be filled with the target material 270. The target controller 71A may heat the target material 270 to a predetermined temperature equal to or higher than the melting point of the target material 270, and adjust the pressure in the target generator 8A to generate the droplet 27.

When the droplet 27 is outputted from the nozzle 82A, the target material 270 in the target generator 8A may pass through the filter part 72A. At this time, as described above, the target pressure Pt to generate the droplet 27 may be applied to the third filter 723A of the filter part 72A. In this case, the support plate 731G may abut on approximately the entire surface of the support plate 736G in the −Z direction side so as to be able to support the support plate 736G. In addition, the support plate 736G supported by the support plate 731G may abut on approximately the entire surface of the third filter 723A in the −Z direction side so as to be able to support the third filter 723A. That is, the support plate 731G and the support plate 736G may support the third filter 723A, sharing the pressure applied to the third filter 723A. As a result, the target supply device 7G may more effectively prevent the third filter 723A from being damaged than Embodiment 1. Moreover, the support plates 736G and 731G supporting the third filter 723A may be arranged such that the bore diameters of the second through-holes 737G and 732G are increased along the output direction of the target material 270. Therefore, the difference in the pressure between the opening of each of the first through-holes 724A of the third filter 723A in the +Z direction side and the opening of each of the first through-holes 724A in the −Z direction side may be smaller than in Embodiment 1. By this means, the stress in the third filter 723A which is generated due to the pressure difference may be smaller than in Embodiment 1. As a result, the target supply device 7G can more effectively prevent the third filter 723A from being damaged than the target supply device A according to Embodiment 1. In addition, the support plate 736G may be formed by a plurality of capillaries like the third filter 723A, and therefore may be manufactured by the same method as the third filter 723A. That is, the support plate 736G may have flexible processability and be manufactured at low cost in the same way as the third filter 723A. As a result, the target supply device 7G can be appropriately formed such that the bore diameter and the number of the second through-holes 737G of the support plate 736G supporting the third filter 723A correspond to the bore diameter and the number of the first through-holes 724A of the third filter 723A. Therefore, the target supply device 7G can meet the demand to reduce the diameter of the droplet 27 to be outputted.

3.9 Configuration Example of the Coating Film

As described above, in order to meet the demand to reduce the diameter of the droplet 27 to be outputted, the target supply device is required to reduce the bore diameter of each of the first through-holes 724A of the third filter 723A. The bore diameter of each of the first through-holes 724A of the third filter 723A may be limited by the inside diameter of each of the capillaries constituting the third filter 723A. The inside diameter of each of the capillaries constituting the third filter 723A may be not easy to be reduced due to a matter of the manufacturing method of the capillaries. Therefore, there is a demand for a technology that can easily reduce the bore diameter of the first through-hole 724A while reducing the diameter of the droplet 27.

3.9.1 Configuration Example 1

Figure 16:
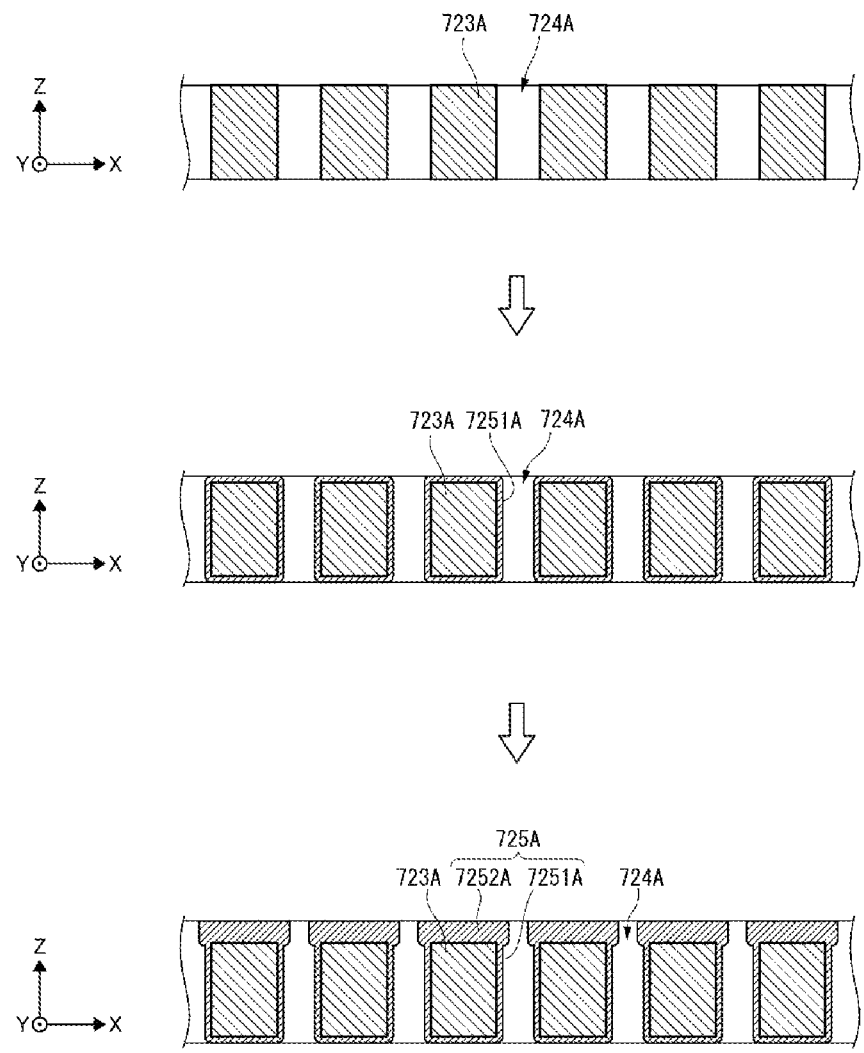
FIG. 16 is a drawing explaining Configuration example 1 of a coating film.

FIG. 16 is a drawing explaining Configuration example 1 of the coating film. For the third filter 723A, some ingenuity may be exercised in the coating film 725A applied to the third filter 723A so as to reduce the bore diameter of the first through-hole 724A. The coating film 725A according to Configuration example 1 may be formed in combination of a conventional evaporation method such as the CVD method or the PVD method with the ALD method.

To be more specific, the third filter 723A provided with the coating film 725A according to Configuration example 1 may be formed by bundling and binding a plurality of capillaries having the first through-holes 724A as shown in the top row of FIG. 16. The capillaries may be the same as the capillaries constituting the third filter 723A of the target supply devices 7A to 7G according to Embodiments 1 to 7. Before providing the coating film 725A, the bore diameter of the first through-hole 724A may be, for example, 1 μm.

Next, the third filter 723A may be provided with the coating film 725A according to Configuration example 1. The coating film 725A according to Configuration example 1 may include a coating film 7251A and a coating film 7252A.

When the coating film 725A according to Configuration example 1 is formed, first, the coating film 7251A may be formed on the third filter 723A by using the ALD method, as shown in the middle row of FIG. 16. The coating film 7251A may be formed on the portion of the third filter 723A which contacts the target material 270. The portion of the third filter 723A which contacts the target material 270 may include the inner surfaces of the first through-holes 724A. The material of the coating film 7251A may be the same as the material of the coating film 725A used in the target supply devices 7A to 7G according to Embodiments 1 to 7. That is, the material of the coating film 7251A may be any of $Al_2O_3$ (aluminium oxide), $Y_2O_3$ (yttrium oxide), $SiO_2$ (silicon dioxide), AlN (aluminum nitride), and $ZrO_2$ (zirconium oxide). Preferably, the material of the coating film 7251A may be $Al_2O_3$ (aluminium oxide). The coating film 7251A may be formed as a thin film with a uniform thickness by using the ALD method. In particular, by using the ALD method, it is possible to apply the coating film 7251A, as a thin film with a uniform thickness, even to the inner surfaces of the first through-holes 724A, which is difficult for conventional evaporation methods.

Next, as shown in the bottom row of FIG. 16, the coating film 7252A may be formed by using a conventional evaporation method such as the CVD method or the PVD method. The coating film 7252A may be formed on the periphery of the opening of the first through-hole 724A in the +Z direction side. Otherwise, the coating film 7252A may be formed on the periphery of the opening of the first through-hole 724A in the +Z direction side, and on the periphery of the opening of the first through-hole 724A in the −Z direction side, respectively. The material of the coating film 7252A may be the same as the material of the coating film 7251A. The thickness of the coating film 7252A may be greater than the thickness of the coating film 7251A. The coating film 7252A may be formed thick on the periphery of the opening of the first through-hole 724A by using a conventional evaporation method, and therefore it is possible to easily reduce the bore diameter of the first through-hole 724A. In a case where the bore diameter of the first through-hole 724A before forming the coating film 7251A is about 1 µm, the bore diameter of the first through-hole 724A after forming the coating film 7252A may be, for example, about 0.26 µm.

As described above, with the coating film 725A according to Configuration example 1, it is possible to easily reduce the bore diameter of the first through-hole 724A by using a combination of the ALD method and a conventional evaporation method. Therefore, the target supply device having the third filter 723A provided with the coating film 725A according to Configuration example 1 can meet the demand to reduce the diameter of the droplet 27.

3.9.2 Configuration Example 2

Figure 17:
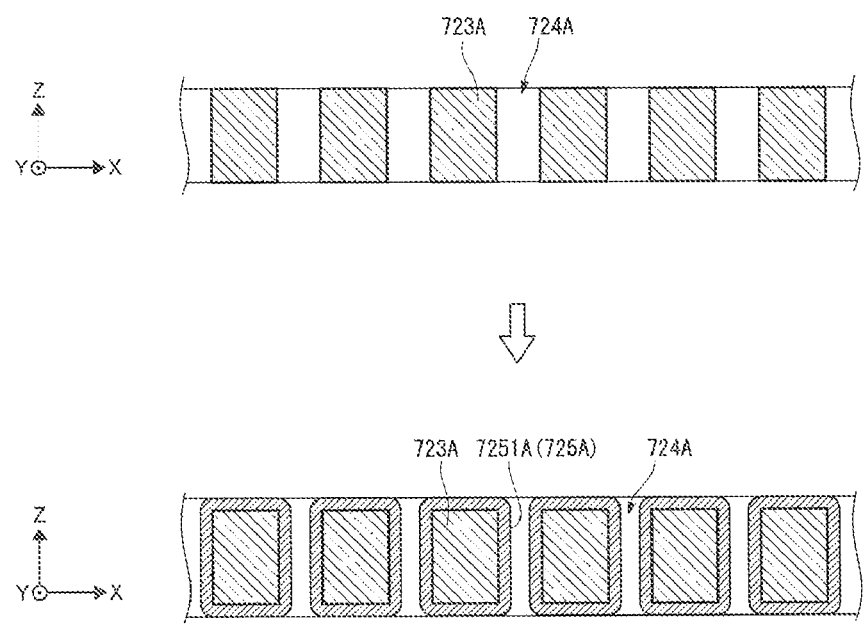
FIG. 17 is a drawing explaining Configuration example 2 of the coating film.

FIG. 17 is a drawing explaining Configuration example 2 of the coating film. The coating film 725A according to Configuration example 2 maybe formed only by the ALD method under a film formation condition adjusted appropriately.

To be more specific, the third filter 723A provided with the coating film 725A according to Configuration example 2 may be formed by bundling and binding a plurality of capillaries having the first through-holes 724A as shown in the upper row of FIG. 17 in the same way as Configuration example 1.

Next, the third filter 723A may be provided with the coating film 725A according to Configuration example 2. As shown in the lower row of FIG. 17, the coating film 725A according to Configuration example 2 may not include the coating film 7252A according to Configuration example 1 but include the coating film 7251A. The portion of the third filter 723A to which the coating film 7251A is applied may be the same as the coating film 7251A according to Configuration example 1. The material of the coating film 7251A may be the same as the material of the coating film 7251A according to Configuration example 1. The thickness of the coating film 7251A may be greater than the thickness of the coating film 7251A according to Configuration example 1.

As described above, the coating film 725A according to Configuration example 2 can also reduce the bore diameter of the first through-hole 724A only by using the ALD method. Therefore, the target supply device having the third filter 723A provided with the coating film 725A according to Configuration example 2 can meet the demand to reduce the diameter of droplet 27.

3.9.3 Configuration Example 3

Figure 18:
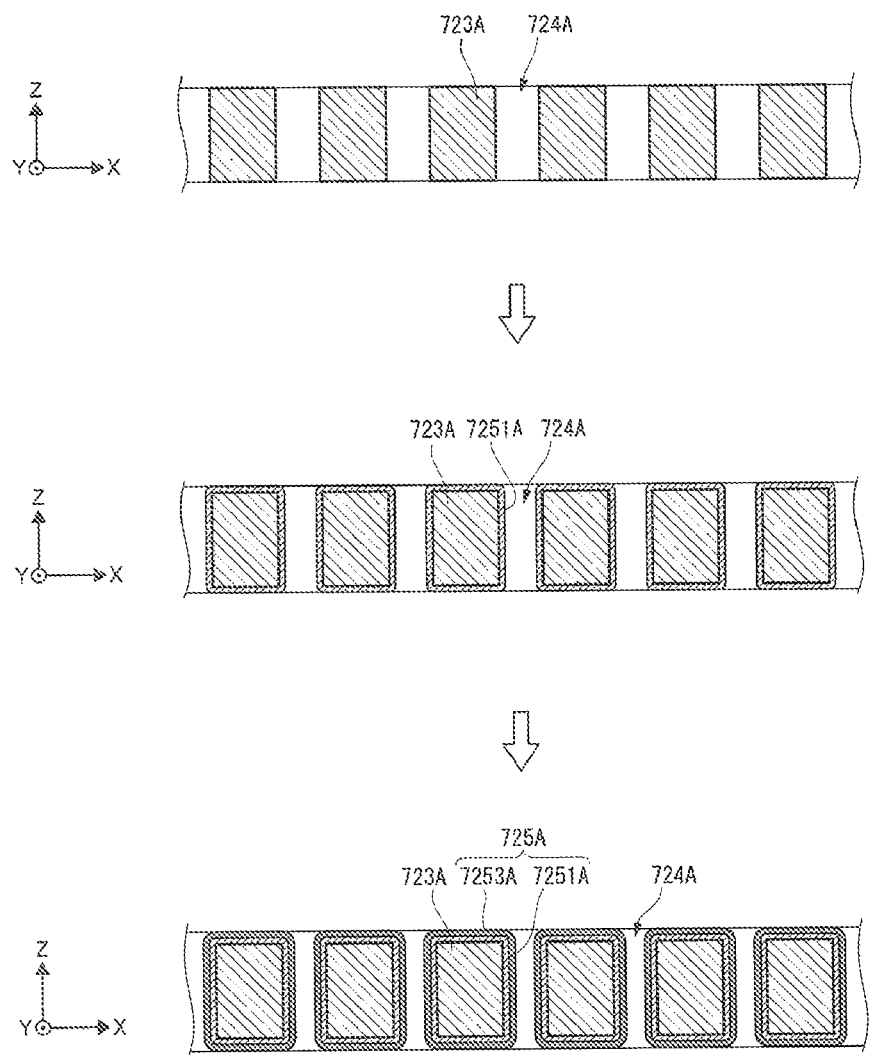
FIG. 18 is a drawing explaining Configuration example 3 of the coating film.

FIG. 18 is a drawing explaining Configuration example 3 of the coating film. The coating film 725A according to Configuration example 3 may be formed only by the ALD method.

To be more specific, the third filter 723A provided with the coating film 725A according to Configuration example 3 may be formed by bundling and binding a plurality of capillaries having the first through-holes 724A as shown in the top row of FIG. 18, in the same way as Configuration example 1.

Next, the third filter 723A may be provided with the coating film 725A according to Configuration example 3. The coating film 725A according to Configuration example 3 may include the coating film 7251A and a coating film 7253A.

When the coating film 725A according to Configuration example 3 is formed, first, the coating film 7251A may be formed on the third filter 723A as shown in the middle row of FIG. 18, by using the ALD method. The portion of the third filter 723A to which the coating film 7251A is applied may be the same as the coating film 7251A according to Configuration example 1. The material of the coating film 7251A may be the same as the material of the coating film 7251A according to Configuration example 1. The thickness of the coating film 7251A may be the same as the thickness of the coating film 7251A according to Configuration example 1.

Next, as shown in the bottom row of FIG. 18, the coating film 7253A may be formed by using the ALD method. The coating film 7253A may be formed to cover the coating film 7251A. The material of the coating film 7253A may be different from the material of the coating film 7251A. The material of the coating film 7253A may not be easy to dissolve in pure water. The material of the coating film 7253A may be $TiO_2$ (titanium oxide). The third filter 723A may be washed by pure water before the third filter 723A is installed in the target supply device. $Al_2O_3$, which is one option of the material of the coating film 725A, normally does not ionize in water, but may dissolve in pure water depending on the film formation method. Then, the surface of the third filter 723A, which is the underlayer of the coating film 725A, may be exposed. By this means, when the third filter 723A is installed in the target supply device, this exposed portion may react with the target material 270, and therefore a reaction product may be generated. As a result, the nozzle hole 854A may be clogged. The coating film 7253A may be formed to cover the coating film 7251A with a material such as $TiO_2$ which is not easy to dissolve in pure water. Therefore, it is possible to exclude the possibility that the coating film 7251A dissolves in pure water, as much as possible.

Moreover, for the coating film 725A according to Configuration example 3, not only the coating film 7251A but also the coating film 7253A is formed, and therefore it is possible to easily reduce the bore diameter of the first through-hole 724A. Therefore, the target supply device having the third filter 723A provided with the coating film 725A according to Configuration example 3 can meet the demand to reduce the diameter of the droplet 27. Moreover, for the coating film 725A according to Configuration example 3, the coating film 7253A made of a material which is not easy to dissolve in pure water is formed to cover the coating film 7251A. By this means, it is possible to prevent the surface of the third filter 723A from being exposed even though the third filter 723A is washed by pure water. Accordingly, the target supply device having the third filter 723A provided with the coating film 725A according to Configuration example 3 can reduce the probability of generating a reaction product of the third filter 723A and the target material 270, as much as possible. As a result, the target supply device having the third filter 723A provided with the coating film 725A according to Configuration example 3 can more stably output the droplet 27 with a smaller diameter. Here, both the coating film 7251A and the coating film 7253A of the coating film 725A according to Configuration example 3 may be made of a material such as $TiO_2$ which is not easy to dissolve in pure water.

4. Modification

Here, for the target supply device and the filter damage prevention device, other configurations as described later are possible. In the target supply device 7A according to Embodiment 1, when the through-pores of the first and second filters 721A and 722A, the first through-holes 724A of the third filter 723A, the second through-holes 732A of the support plate 731A, the through-hole 833A and the through-hole 853A are not filled with the target material 270, the method of preventing filter damage according to Embodiment 6 may be employed to fill the target material 270 in the above-described through-pores and the through-holes 724A, 732A, 833A, and 853A. The method of preventing filter damage may be employed in the target supply devices 7B, 7C, 7D, 7E and 7G according to Embodiments 2, 3, 4, 5, and 7. The support plate 731A may be made of quartz glass or sapphire. The support plate 731D may be made of molybdenum or sapphire. With Embodiments 1, 3, 4, 6, and 7, both the first and second filters 721A and 722A are not necessarily provided, but only one of them may be provided. With Embodiment 5, only one of the first filter 721A and the second filter 722A may be provided. The target supply devices 7B, 7C, 7D,7E, and 7G according to Embodiments 2, 3, 4, 5, and 7 may be applicable to Embodiment 6, instead of the target supply device 7A.

Configuration examples 1, 2, and 3 of the coating film 725A shown in FIGS. 16, 17 and 18 may be applicable to the coating film 725A according to Embodiments 1, 2, 3, 4, 5, 6, and 7.

The descriptions above are intended to be illustrative on and the present disclosure is not limited thereto. Therefore, it will be apparent to those skilled in the art that it is possible to make modifications to the embodiments of the present disclosure within the scope of the appended claims.

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the indefinite article " (a/an)" should be interpreted as "at least one" or "one or more."

REFERENCE SIGNS LIST 7A, 7B, 7C, 7D, 7E, 7F, 7G: target supply device
8A, 8B, 8C: target generator
74A, 74C: positioning part
82A, 82B, 82C: nozzle
270: target material
723A: third filter
724A: first through-hole
731A, 731B, 731D, 731G: support plate (support member)
732A, 732B, 732D, 732G: second through-hole
854A: nozzle hole

The invention claimed is:

1. A target supply device comprising:
   a target generator configured to accommodate a liquid target material and having a nozzle with a nozzle hole from which the liquid target material is outputted; and
   a filter disposed in the target generator and made of glass, the glass reacting with the liquid target material, so that a solid reaction product is generated, wherein:
   the filter includes a first through-hole configured to allow the liquid target material to pass therethrough; and
   an inner surface of the first through-hole is coated with a material which is not easy to react with the liquid target material.

2. The target supply device according to claim 1, wherein the filter is made of the glass containing lead.

3. The target supply device according to claim 2, wherein the material includes $Al_2O_3$ (aluminium oxide), $Cr_2O_3$ (chromium (III) oxide), $Y_2O_3$ (yttrium oxide), or $TiB_2$ (titanium boride).

4. The target supply device according to claim 2, wherein the material includes $Al_2O_3$ (aluminium oxide), $Y_2O_3$ (yttrium oxide), $SiO_2$ (silicon dioxide), AlN (aluminum nitride) or $ZrO_2$ (zirconium oxide).

5. The target supply device according to claim 1, further comprising:
   a support member configured to abut on a surface of the filter in the nozzle hole side so as to support the filter; and
   a positioning part configured to position the filter and the support member in the target generator,
   wherein the support member includes a second through-hole having a bore diameter greater than a bore diameter of the first through-hole to allow the liquid target material flowing out of the first through-hole to flow therethrough.

6. A target supply device comprising:
   a target generator configured to accommodate a liquid target material and having a nozzle with a nozzle hole from which the liquid target material is outputted;
   a filter disposed in the target generator and made of glass or a ceramic;
   a support member configured to abut on a surface of the filter in the nozzle hole side so as to support the filter; and
   a positioning part configured to position the filter and the support member in the target generator, wherein:
   the filter includes a first through-hole configured to allow the liquid target material to flow therethrough; and
   the support member includes a second through-hole having a bore diameter greater than a bore diameter of the first through-hole to allow the liquid target material flowing out of the first through-hole to flow therethrough.

7. The target supply device according to claim 6, wherein the support member is made of molybdenum, quartz glass, or sapphire.

* * * * *